(12) United States Patent
Gullicksen et al.

(10) Patent No.: US 11,086,124 B2
(45) Date of Patent: Aug. 10, 2021

(54) DETECTING VELOCITY STATE OF A DEVICE

(71) Applicant: Reavire, Inc., Campbell, CA (US)

(72) Inventors: Jeff Gullicksen, Mountain View, CA (US); Steve deRosier, Fairfield, CA (US)

(73) Assignee: Reavire, Inc., Campbell, CA (US)

( * ) Notice: Subject to any disclaimer, the term of this patent is extended or adjusted under 35 U.S.C. 154(b) by 262 days.

(21) Appl. No.: 16/422,073

(22) Filed: May 24, 2019

(65) Prior Publication Data

US 2019/0383897 A1 Dec. 19, 2019

Related U.S. Application Data

(60) Provisional application No. 62/803,075, filed on Feb. 8, 2019, provisional application No. 62/684,586, filed on Jun. 13, 2018.

(51) Int. Cl.
| | |
|---|---|
| *G01S 1/02* | (2010.01) |
| *G02B 27/00* | (2006.01) |
| *G02B 27/01* | (2006.01) |
| *G01R 33/07* | (2006.01) |
| *G01S 5/02* | (2010.01) |
| *G01S 5/06* | (2006.01) |
| *G01S 11/02* | (2010.01) |

(Continued)

(52) U.S. Cl.
CPC ....... *G02B 27/0093* (2013.01); *G01R 33/072* (2013.01); *G01S 5/0226* (2013.01); *G01S 5/06* (2013.01); *G01S 11/026* (2013.01); *G02B 27/0172* (2013.01); *G02B 2027/0138* (2013.01); *G02B 2027/0161* (2013.01); *G02B 2027/0187* (2013.01); *G06F 3/012* (2013.01); *G06F 3/0346* (2013.01); *H01Q 21/28* (2013.01)

(58) Field of Classification Search
CPC ............ G02B 27/0093; G02B 27/0172; G01R 33/072; H04W 16/28; H04B 7/10; H01Q 1/52; H01Q 3/26; G01S 1/02; G01S 5/06; G01S 5/0226; G01S 11/026
USPC ........................................................ 342/367
See application file for complete search history.

(56) References Cited

U.S. PATENT DOCUMENTS

| | | | |
|---|---|---|---|
| 5,917,449 A | 6/1999 | Sanderford et al. | |
| 6,249,680 B1 | 6/2001 | Wax et al. | |

(Continued)

FOREIGN PATENT DOCUMENTS

| | | |
|---|---|---|
| CN | 104902564 | 9/2015 |
| KR | 1020160000873 | 1/2016 |

(Continued)

OTHER PUBLICATIONS

"Best room-scale games for the HTC Vive", Jul. 25, 2017, 9 pages. https://www.vrheads.com/best-room-scale-games-htc-vive.

(Continued)

*Primary Examiner* — Harry K Liu
(74) *Attorney, Agent, or Firm* — BainwoodHuang

(57) ABSTRACT

A technique for detecting a velocity state of a device includes generating multiple phase measurements for each of multiple packets emitted by the device and monitoring differences between phase measurements made for different packets. The technique further includes asserting a particular velocity state of the device based on a condition of the monitored differences.

20 Claims, 10 Drawing Sheets

(51) Int. Cl.
*G06F 3/01* (2006.01)
*G06F 3/0346* (2013.01)
*H01Q 21/28* (2006.01)

(56) References Cited

U.S. PATENT DOCUMENTS

| | | | |
|---|---|---|---|
| 6,292,751 | B1 | 9/2001 | Frank |
| 7,692,532 | B2 | 4/2010 | Fischer et al. |
| 8,150,384 | B2 | 4/2012 | Abifaker et al. |
| 8,952,785 | B2* | 2/2015 | Dijkstra .............. H04Q 9/00 340/8.1 |
| 9,001,120 | B2 | 4/2015 | Steedly et al. |
| 9,001,129 | B2 | 4/2015 | Rhee et al. |
| 9,041,622 | B2 | 5/2015 | McCulloch et al. |
| 9,084,217 | B2 | 7/2015 | Wax et al. |
| 9,288,632 | B2 | 3/2016 | Yang et al. |
| 9,516,503 | B2 | 12/2016 | Berns et al. |
| 9,568,587 | B2 | 2/2017 | Faragher et al. |
| 9,843,772 | B2 | 12/2017 | Lee et al. |
| 2004/0080412 | A1 | 4/2004 | Smith et al. |
| 2006/0022815 | A1 | 2/2006 | Fischer et al. |
| 2006/0143292 | A1 | 6/2006 | Taubenheim et al. |
| 2009/0325598 | A1* | 12/2009 | Guigne ................ G01S 5/06 455/456.1 |
| 2010/0004860 | A1* | 1/2010 | Chernoguz .......... G01C 22/006 701/494 |
| 2010/0293607 | A1 | 11/2010 | Hall et al. |
| 2011/0293040 | A1* | 12/2011 | Dupont .............. H04L 27/2684 375/316 |
| 2011/0309972 | A1* | 12/2011 | Lok ................... H01Q 1/185 342/161 |
| 2013/0172007 | A1 | 7/2013 | Wax et al. |
| 2013/0244684 | A1 | 9/2013 | Kadous et al. |
| 2013/0328762 | A1 | 12/2013 | McCulloch et al. |
| 2014/0295878 | A1 | 10/2014 | Yang et al. |
| 2015/0121465 | A1 | 4/2015 | Berns et al. |
| 2015/0233743 | A1* | 8/2015 | Fung ................... G01C 23/00 702/187 |
| 2015/0301188 | A1* | 10/2015 | Broderick ............. G01S 19/23 342/357.68 |
| 2016/0026253 | A1 | 1/2016 | Bradski et al. |
| 2016/0127372 | A1 | 5/2016 | Unterschuetz |
| 2016/0205352 | A1 | 7/2016 | Lee et al. |
| 2018/0205963 | A1* | 7/2018 | Matei ................. H04N 21/816 |
| 2019/0279479 | A1* | 9/2019 | Reunamaki .......... A61B 5/1102 |

FOREIGN PATENT DOCUMENTS

| | | |
|---|---|---|
| WO | 2003075125 | 12/2003 |
| WO | 2013028908 | 2/2013 |

OTHER PUBLICATIONS

"Decimeter-Level Localization with a Single WiFi Access Point", Mar. 16-18, 2016, 15 pages. https://www.usenix.org/system/files/conference/nsdi16/nsdi16-paper-vasisht.pdf.

"Hololens Inside-out Tracking Is Game Changing for AR & VR, and No One Is Talking about it", Sep. 20, 2016, 4 pages. https://www.roadtovr.com/microsoft-hololens-inside-out-tracking-augmented-reality-virtual-reality-ar-vr/.

"Mist Systems: Wi-Fi Assurance and BLE Location Services", 2018, 6 pages. https://www.mist.com/services/#enterprise-grade-ble.

"Oculus Rift Officially Brings Room Scale to the VR Platform", May 26, 2017, 4 pages. https://www.gamespot.com/articles/oculus-rift-officially-brings-room-scale-to-the-vr/1100-6450377.

"Shared experiences in mixed reality", Mar. 21, 2018, 7 pages. https://developermicrosoft.com/en-us/windows/mixed-reality/shared_experiences_in_mixed_reality.

"SpotFi: Decimeter Level Localization Using WiFi", Aug. 17-21, 2015, 14 pages. https://web.stanford.edu/~skatti/pubs/sigcomm15-spotfi.pdf.

"Virtual reality", Wikipedia, Apr. 22, 2018, 14 pages. https://en.wikipedia.org/wiki/Virtual_reality.

International Application No. PCT/US2017/055582 International Search Report and Written Opinion including PCT/ISA/220, PCT/ISA/210, and PCT/ISA/237 to Gullicksen Brothers, LLC, dated Jan. 22, 2018, 17 pages.

Li Bing et al: CSI-Based WiFi-Inertial State Estimation; 2016 IEEE International Conference on Multisensor Fusion and Integration for Intelligent Systems (MFI), IEEE, Sep. 19, 2016, pp. 245-250.

International Application No. PCT/US2017/047154 International Search Report and Written Opinion including PCT/ISA/220, PCT/ISA/210, and PCT/ISA/237 to Gullicksen Brothers, LLC, dated Nov. 6, 2017, 15 pages.

Logitech Spotlight Wireless Presentation Remote web pages downloaded from https://www.logitech.com/en-us/product/spotlight-presentation-remote.

Shop Nintendo, Nintendo Online Store web pages downloaded from https://store.nintendo.com/ng3/browse/productDetailColorSizePicker.jsp?productId=prod300018.

Mira Prism Augmented Reality Headset web pages downloaded from https://www.mirareality.com/.

Domotics: "La HC2 de Fibaro gere aussi les cameras IP"; Dec. 19, 2013; pp. 1-12.

"Fibaro UK Permissions & Access control"; Feb. 2, 2016; 4 pages.

"Zero-Velocity Detection—An Algorithm Evaluation", IEEE Transactions on Biomedical Engineering, Dec. 2010, 12 pages.

* cited by examiner

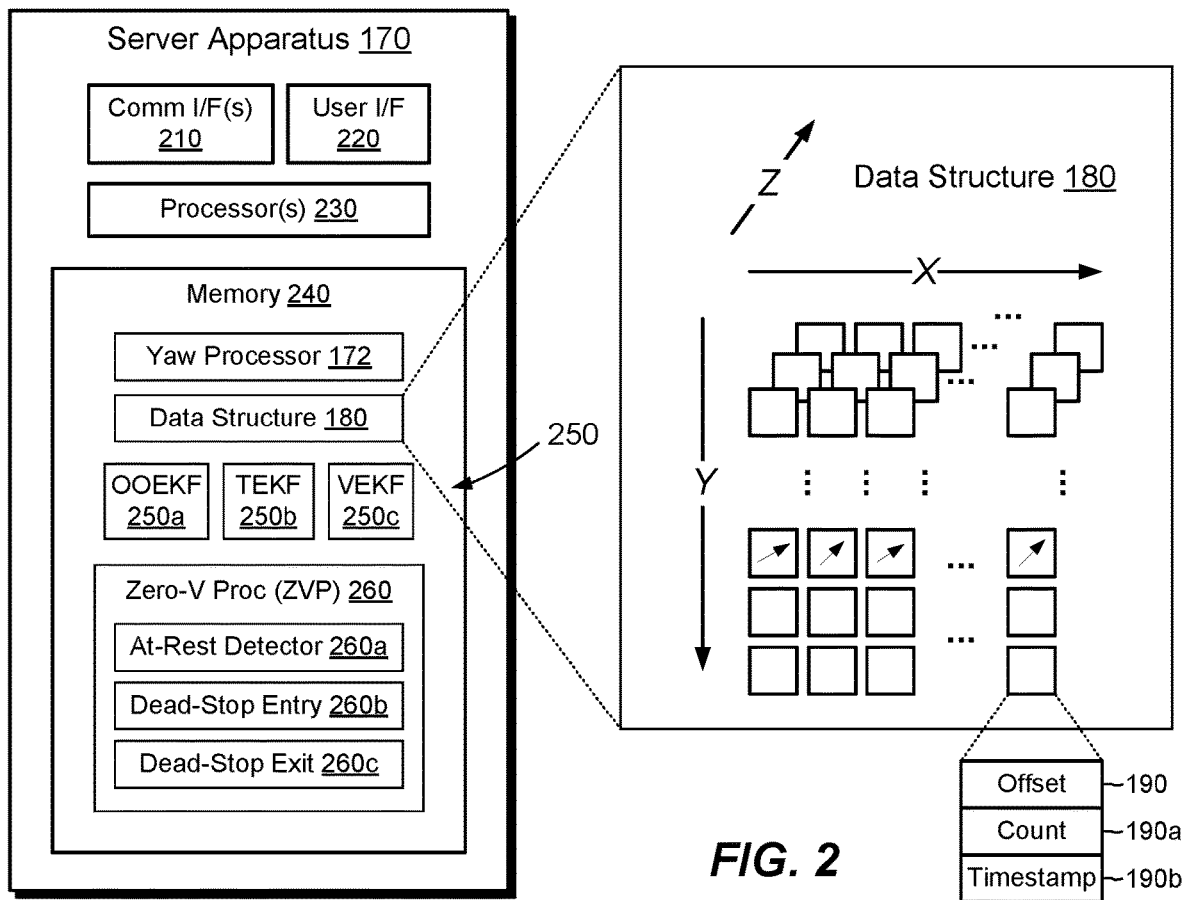
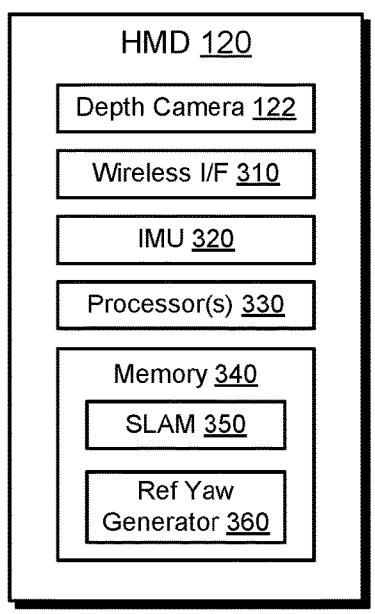
FIG. 3
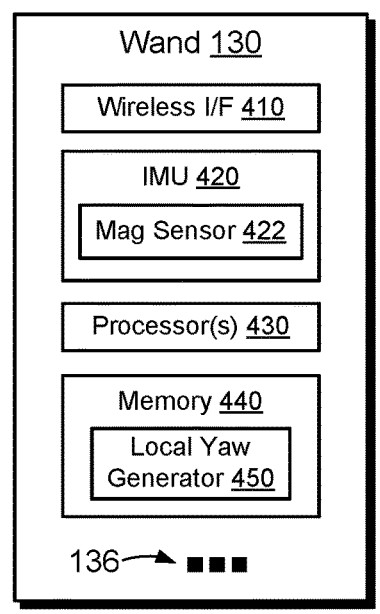
FIG. 4

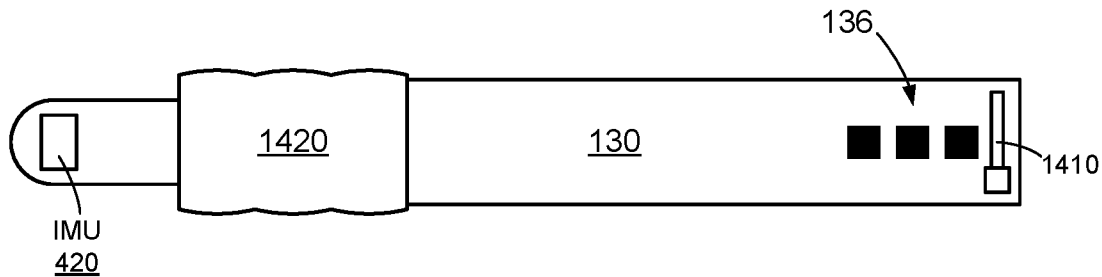
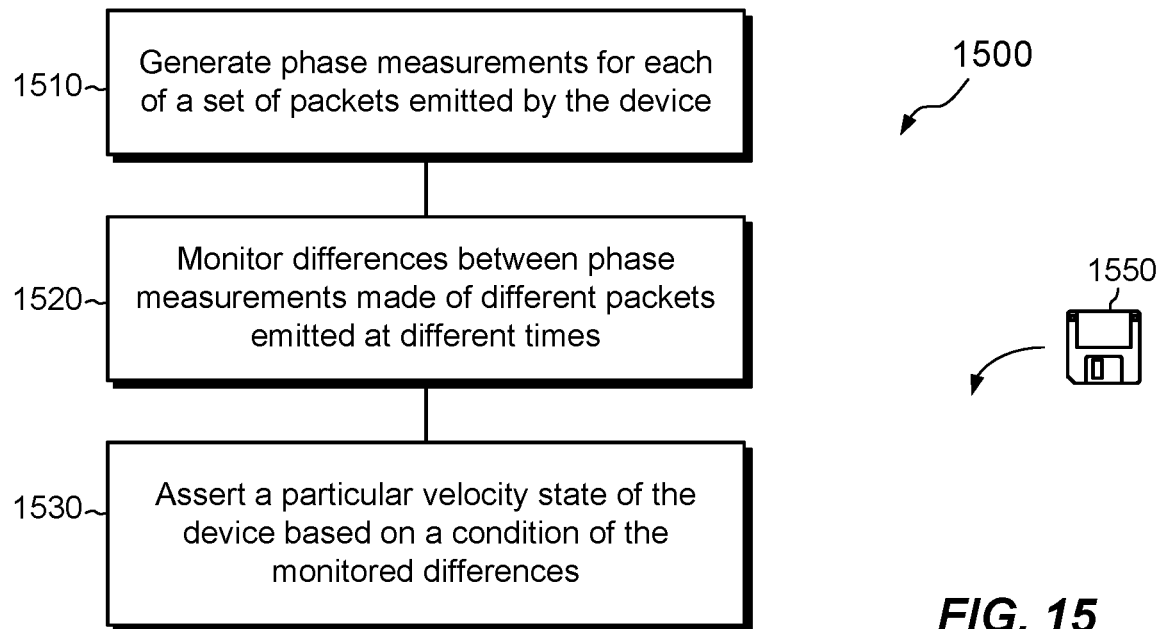
FIG. 14
FIG. 15

DETECTING VELOCITY STATE OF A DEVICE

CROSS-REFERENCE TO RELATED APPLICATIONS

This application claims the benefit of U.S. Provisional Application No. 62/684,586, filed Jun. 13, 2018, and of U.S. Provisional Application No. 62/803,075, filed Feb. 8, 2019. The contents and teachings of these applications are incorporated herein by reference in their entirety.

BACKGROUND

Developers of commercial products and military equipment have implemented numerous solutions for tracking devices in three-dimensional space. For example, GPS (Global Positioning System) trackers can locate devices to within meters and can track device motions and speed. Some systems use triangulation or trilateration to locate radio-frequency-emitting devices, such as cell phones and Wi-Fi devices, and to track their movements.

Many devices use inertial measurement units (IMUs) for tracking movement. IMUs include a variety of sensors, such as accelerometers, gyroscopes, and/or magnetometers. As IMUs are extremely sensitive to motion and applied forces, IMUs find many useful applications in estimating device locations, directions, and speed.

SUMMARY

IMUs suffer from a well-known weakness, however, in that they have a tendency to drift and accumulate large errors over time. To track location, an IMU may sense acceleration, integrate the acceleration over time to obtain velocity, and then integrate again to obtain position. Large errors can quickly accumulate, in under a second in some cases. Most applications that use IMUs for sensing position therefore rely upon other sources of information to correct IMU-based errors. For example, a vehicle navigation system may employ an IMU to track short-term changes in position, speed, or direction, but may regularly apply GPS information to locate a vehicle more accurately.

Similar issues arise when using IMUs to track movements and positions of game controllers, remote controllers, wearable sensors, head-mounted displays (HMDs), and the like. Although IMUs can track movements and poses of users who carry or wear the IMUs, the usefulness of these IMUs can be limited unless their measurements can be corrected regularly.

Some applications use IMUs to detect foot falls, i.e., instances when a user places a foot on the floor with enough force to trigger detection by an accelerometer. When an application detects a foot-fall from an IMU, the application may assume that the user has momentarily stopped moving and may use the assumed zero-velocity condition to correct the IMU's error or to disregard its output with respect to movement. Such solutions are themselves subject to large errors, however, as well as to false positives. In addition, relying on a foot fall means that a zero-velocity detection is event-driven and may occur rarely, allowing IMU errors to accumulate between events without correction. The quality of game play or other application performance may suffer as a result.

In contrast with prior approaches, an improved technique for detecting a velocity state of a device includes generating multiple phase measurements for each of multiple packets emitted by the device and monitoring differences between phase measurements made for different packets. The technique further includes asserting a particular state of the device based on a condition of the monitored differences. In some examples, detecting the particular state can trigger a correction for IMU drift.

Advantageously, embodiments of the improved technique determine the particular velocity state of the device in response to packets emitted by the device and thus can be repeated at short intervals, which may be much less than a second. Rather than having to wait for a foot-fall or other triggering event, which may take a long time to occur, the improved technique can operate nearly continuously from the standpoint of human users. In addition, the improved technique is more accurate than the foot-fall approach, as it is based on measurement from the device that directly indicates the velocity condition, rather than being based on an assumption about velocity from a foot-fall.

When used in a device that provides an IMU to track motion, each detection of a low or zero-velocity state of the device can trigger a new correction of motion data from the IMU, reducing deleterious effects of drift and enabling smoother, more accurate performance.

Certain embodiments are directed to a method of detecting a velocity state of a device. The method includes generating phase measurements for each of a set of packets emitted by the device, monitoring differences between phase measurements made of different packets emitted at different times, and asserting a particular velocity state of the device based on a condition of the monitored differences.

Other embodiments are directed to a computerized system that includes a device that emits packets, a server, and a set of antenna arrays. The server is constructed and arranged to perform a method of detecting a velocity state of a device, such as the method described above. Still other embodiments are directed to a computer program product. The computer program product stores instructions which, when executed on control circuitry of a computerized apparatus, cause the computerized apparatus to perform a method of detecting a velocity state of a device, such as the method described above.

The foregoing summary is presented for illustrative purposes to assist the reader in readily grasping example features presented herein; however, this summary is not intended to set forth required elements or to limit embodiments hereof in any way. One should appreciate that the above-described features can be combined in any manner that makes technological sense, and that all such combinations are intended to be disclosed herein, regardless of whether such combinations are identified explicitly or not.

BRIEF DESCRIPTION OF THE SEVERAL VIEWS OF THE DRAWINGS

The foregoing and other features and advantages will be apparent from the following description of particular embodiments, as illustrated in the accompanying drawings, in which like reference characters refer to the same or similar parts throughout the different views. The drawings are not necessarily to scale, emphasis instead being placed upon illustrating the principles of various embodiments.

FIG. 2 is a block diagram of an example server apparatus used in the environment of FIG. 1.

FIG. 3 is a block diagram of an example head-mounted display (HMD) used in the environment of FIG. 1.

FIG. 4 is a block diagram of an example device (e.g., wand) used in the environment of FIG. 1.

FIG. 14 is a top view of a device that is adapted for accurate measurements of orientation and movement.

FIG. 15 is a flowchart showing an example method of detecting a velocity state of a device.

DETAILED DESCRIPTION

Embodiments of the improved technique will now be described. One should appreciate that such embodiments are provided by way of example to illustrate certain features and principles but are not intended to be limiting.

This disclosure is presented in the following sections:

Section I describes example techniques for measuring a yaw direction of a device in space; add Section II describes example techniques for detecting a velocity state of a device.

Section I: Yaw Measurement

This section describes an improved technique for measuring yaw (left-right direction) of a device. The technique includes obtaining a first measurement of an orientation of the device relative to a local magnetic frame of reference (FoR) and a second measurement of the orientation of the device relative to a spatial FoR, with both measurements made while the device is disposed at a known location and in the same orientation. The technique further includes computing an offset between the two measurements and storing the offset in connection with the known location. When the device later returns to the same location, the yaw direction of the device is determined based on acquiring a new measurement of the device's orientation in the local magnetic FoR and applying the offset as a correction.

Figure 1:
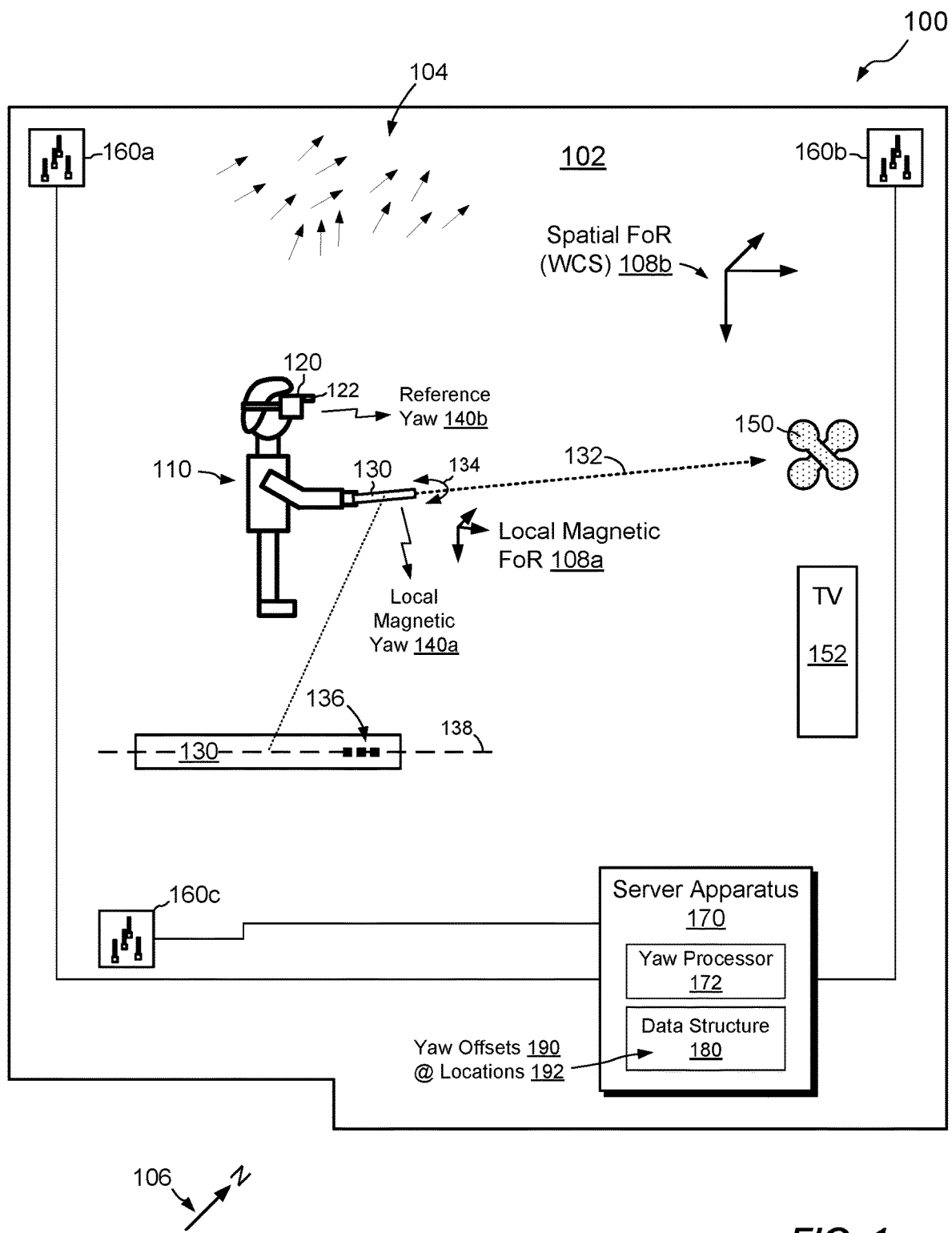
FIG. 1 is a block diagram of an example environment in which embodiments of the improved technique can be practiced.

FIG. 1 shows an example environment 100 in which embodiments of the improved technique can be practiced. As shown, the environment 100 includes a physical space 102, such as a room, building, or other indoor or outdoor area. The space 102 is permeated by a magnetic field 104, which tends to vary over space, as shown by the differently-pointing arrows. Although depicted for neatness over only a small patch of the space 102, the magnetic field 104 extends throughout the entire space 102 and roughly aligns with the Earth's magnetic field 106. Variability in the magnetic field 104 as measured in the space 102 may arise from nearby objects that have magnetic properties. To the extent that these objects do not change location or operating state over time (an appliance might produce different magnetic effects when on than when off), the magnetic field 104 remains stationary, varying over space but not significantly over time. The magnetic field 104 in the space 102 can thus be regarded as quasi-stationary.

As further shown, a user 110 in the space 102 wears a head-mounted display (HMD) 120 and holds a device 130. The HMD 120 may be VR (Virtual Reality) goggles, AR (Augmented Reality) goggles, MR (Mixed Reality) goggles, or the like, with suitable examples including the Microsoft HoloLens, Oculus Rift, or Magic Leap. The HMD 120 may include a camera, such as a wide-field depth camera 122, which the HMD 120 uses for imaging its surroundings in three dimensions. For example, the depth camera 122 generates images and projects pulses of light in the environment 100. The depth camera 122 uses reflections of those pulses to detect depth, such that pixels in the generated images have associated depth values. The field of view of the depth camera 122 is typically wide enough to include the device 130, even if the user 110 is not looking directly at the device 130 through the HMD 120. Embodiments are not limited to depth cameras, to depth cameras that operate as described, or even to cameras, however.

Both the HMD 120 and the device 130 are capable of wireless communication, such as using Wi-Fi and/or Bluetooth. The device 130 includes an IMU (Inertial Measurement Unit) configured to measure the device's orientation in space, e.g., using a gravity sensor and a magnetometer. The magnetometer is configured to sense the local magnetic field 104 and to establish a local magnetic frame of reference (FoR), which enables the device 130 to orient itself in a yaw (left-right) direction 134, such as by measuring its own yaw angle with respect to the direction of local magnetic north. In a particular example, device 130 is a wireless pointing device configured to project a virtual ray 132 for selecting and controlling objects, such as hologram 150 (a virtual object) or TV 152 (a physical object). Ideally, the virtual ray 132 aligns with a long axis 138 of the device 130. The pointing device 130 may construct the virtual ray 132 based on knowledge of its own location and knowledge of the angle in which it is pointing. An example of a pointer device that meets this description is disclosed in U.S. patent application Ser. No. 15/655,489, filed Jul. 20, 2017, the contents and teachings of which are incorporated herein by reference in their entirety. Embodiments are not limited to this type of pointing device, however, but rather may include any type of device capable of sensing and reporting its own yaw direction relative to a local magnetic field. Many common devices satisfy these requirements, such as certain smart phones, tablet computers, PDAs (Personal Data Assistants), gaming consoles, remote controls, and the like.

Disposed at one or more locations around the space 102 are antenna arrays 160. Three antenna arrays 160a, 160b, and 160c are shown, but the space 102 may include any number of antenna arrays 160, including only a single antenna array. Each antenna array 160 includes one or more antennas and connects to a server apparatus, or simply "server," 170. Details of the antenna arrays 160 are not critical for purposes of yaw correction, as any conventional Wi-Fi (IEEE 802.11) or Bluetooth antenna will suffice. In some examples, an antenna array 160 is integrated with the server 170 in a single assembly. As shown, server 170 includes a yaw processor 172 and a data structure 180.

In example operation, the user 110 moves around the space 102, wearing the HMD 120 and holding the device 130. The user 110 may wish to use the device 130 as a pointer to various objects, such as hologram 150 or TV 152 (the HMD 120 may render the hologram 150 to the user). A problem arises, however, in that the device 130 on its own can only determine its yaw direction 134 relative to its own local magnetic north, e.g., based on magnetic north as measured by the magnetometer in its IMU. The magnetometer in device 130 may be accurate for measuring local magnetic north, but that local magnetic north may not be pointing to true magnetic north and typically varies from one place to another within the space 102. Given that the pointing accuracy of the virtual ray 132 is only as good as the knowledge of yaw direction 134, erroneous knowledge arising from variations in magnetic field 104 can cause large pointing errors.

To address these errors, embodiments map the local magnetic field 104 over portions of the space 102. Mapping may be accomplished by obtaining measurements of the device's orientation in a local magnetic FoR 108a and comparing them with measurements, made by a separate instrument, of the device's orientation in a spatial FoR 108b, thus producing respective yaw offsets 190. In an example, the local magnetic FoR 108a is based on a magnetic sensor and a gravity sensor in the device 130, and the spatial FoR 108b is based on geometry of the space 102. Spatial FoR 108b is expressed in a coordinate system of the space 102, which we call a World Coordinate System, or "WCS." The WCS may be an X-Y-Z coordinate system, or some other spatial coordinate system. We refer to an orientation measurement made in the local magnetic FoR 108a as a "local magnetic yaw" 140a, and to an orientation measurement in the spatial FoR 108b as a "reference yaw" 140b. Each yaw offset 190 can thus be regarded as a difference between a reference yaw 140b and a local magnetic yaw 140a. The server 170 stores yaw offsets 190 in data structure 180 in connection with corresponding locations 192. Later, when the device 130 returns to the same locations, the server 170 may apply the yaw offsets 190 to correct new measurements of local magnetic yaw 140a at the same locations, without the need to obtain new measurements of reference yaw 140b. Over time, the data structure 180 realizes an offset map that enables devices to estimate their true yaw directions merely by measuring their own local magnetic yaw 140a and applying offsets 190 for the respective locations as corrections.

Reference yaw values 140b may be provided by any observer that is capable of imaging the device 130 and expressing its spatial yaw in the spatial (WCS) FoR 108b. We have found that the depth camera 122 is well-suited for this task, as the HMD 120, which contains the depth camera 122, generally has possession of its own location and orientation in the spatial FoR 108b. By imaging the device 130 using the depth camera 122, the HMD 120 can process the image and calculate values of reference yaw 140b of the device 130 relative to the spatial FoR 108b.

Certain optimizations may facilitate this task. For example, the device 130 may be equipped with markings 136, such as shiny black regions, which the depth camera 122 interprets as distant areas or holes. The depth holes left by the markings 136 enable the HMD 120 to calculate the location and orientation of the device 130 relative to a local FoR of the HMD 120, and to translate that location into the spatial FoR 108b. One should appreciate that embodiments are not limited to devices having markings or to the use of depth cameras. For example, other cameras or imaging instruments having known locations may be used, and those instruments may rely on features other than markings 136 for locating and orienting the device 130.

As the user 110 moves to different locations in the space 102, the magnetic sensor in the device 130 measures yaw directions of the device 130 and the device 130 processes those yaw directions to produce values of local magnetic yaw 140a. At the same locations, the HMD 120 captures respective images of the device 130 using the depth camera 122 and generates respective values of reference yaw 140b. The two measurements 140a and 140b for a given location preferably derive from an image and a magnetic sample acquired simultaneously, or nearly so, so that each measurement pair {140a, 140b} reflects the same location 192 and the same physical orientation of the device 130. In an example, device 130 sends its measurements of magnetic yaw 140a to the server 170, and HMD 120 does likewise for its measurements of reference yaw 140b. For each pair of measurements {140a, 140b}, the server 170 computes a respective yaw offset 190 (e.g., as 140b minus 140a) and stores the yaw offset 190 in connection with the respective location 192, i.e., the location of the device 130 at which the image and magnetic sample for that measurement pair were acquired.

Over time, the server 170 fills the data structure 180 with offset values 190 for the respective locations 192. As individual offset values are likely to have significant noise, the server 170 may apply averaging to promote smoothness. For example, if a location 192 is visited more than once, the server 170 may generate a new offset 190 for that location and average the new offset with the existing one. In some examples, the data structure 180 maintains a count of the number of visits to each location 192 and computes the average as a weighted average. For instance, if the current visit to a location is the tenth visit to that location, the new offset may be given a weight of one-tenth. In some examples, old values of offset are given lower weights than newer ones, allowing the data structure 180 to adapt to changes in local magnetic field 104 by aging out older values. In some examples, the data structure 180 also stores a timestamp that indicates the last time a new offset at each location 192 was generated. Very old entries, as indicated by timestamp, may be aged out more aggressively than newer ones.

In some examples, particularly those in which pointing accuracy is especially critical, the server 170 waits for some level of offset averaging to occur before it allows offsets to be used for yaw correction. For example, the server 170 may wait for the count at a current location to exceed a threshold, may wait for a certain amount of time to pass (as measured by a difference between the current time and the timestamp for that location), and/or may wait until the offset at the current location changes by more than a specified amount.

In some examples, the server 170 also uses averaging when responding to offset requests. For example, when the device 130 enters a previously-visited location, the device can measure its local magnetic yaw 140a and contact the server 170 for the corresponding offset for that location. Rather than responding with only that one offset value (the one stored for the current location) the server 170 may instead compute a spatial average of the current offset with offsets of its neighbors, where a "neighbor" is a location adjacent to the current location. Depending on the dimensional granularity of the data structure 180, only immediately adjacent neighbors may be averaged together, or neighbors within a specified bounding region may be averaged together. The averaging need not be uniform. For example, closer offsets may be given higher weights in the averaging than more distant ones, and offsets with higher counts and/or more recent timestamps may be given higher weights than those with lower counts and/or older timestamps, which are less likely to be reliable.

Sometimes, the device 130 enters a location 192 for which no offset 190 has been stored, but the depth camera 122 or other instrument is blocked (or otherwise unavailable) and cannot image the device 130. In such cases, the server 170 may estimate an offset for the current location based on offsets of the current location's neighbors. For example, the server 170 may average neighboring offsets, giving higher weights to closer, newer, and/or more-often visited locations than to those that are less so. Thus, the server 170 is capable of producing a corrected yaw measurement for a location, even in the absence of any reference yaw 140b of the device 130 at that location.

Over time, acquiring measurements of reference yaw 140b (e.g., from depth camera 122) may become less necessary, as offsets in the data structure 180 tend to stabilize. Then, the device 130 may rely on offsets 190 as being correct and simply apply the offsets to its local magnetic yaw measurements 140a to generate corrected values of yaw, checking them with new reference yaw measurements 140b only occasionally. In some examples, the server 170 may perform spatial averaging of offsets as a general rule when responding to offset requests. Such spatial averaging has the effect of smoothing pointer direction when the device 130 is moving and helps to prevent sudden jumps. In some examples, the particulars of spatial averaging depend on detected motion. For example, if it is known that the device 130 is stationary (e.g., using the techniques described in Section II), the spatial averaging may be uniform in direction and may cover only a small region surrounding the current location. However, if it is known that the device 130 is moving in a particular direction, then spatial averaging may be biased in favor of the known direction, giving more weight to offsets at locations in the direction of motion than to offsets in other directions.

Although the server 170 may generate each value of offset 190 based on a single image and a single magnetic sample, some embodiments use multiple images and/or magnetic samples to generate a single offset value. For example, the server 170 may provide one or more Kalman filters to estimate and smooth measurements of local magnetic yaw 140a and/or reference yaw 140b. Also, if the device 130 is known to be stationary at a particular moment, the server 170 may leverage this knowledge of the stationary state to narrow the variance of the Kalman filter(s) and/or to perform other averaging, filtering, and/or processing, for improving the accuracy of the offset value by reducing its noise.

FIGS. 2-4 show more detailed views of the server 170, HMD 120, and device 130, respectively. As shown in FIG. 2, the server 170 includes one or more communication interfaces 210, such as Wi-Fi and/or Bluetooth interfaces and an Ethernet interface, a user interface 220 (e.g., mouse, keyboard, monitor, etc.), a set of processors 230 (e.g., one or more processor chips, co-processors, and/or assemblies), and memory 240. The memory 240 may include both volatile memory, such as random-access memory (RAM), and non-volatile memory, such as one or more disk drives, solid state drives, or the like. The set of processors 230 and the memory 240 form control circuitry, which is constructed and arranged to carry out various methods and functions as described herein. Also, the memory 240 includes a variety of software constructs realized in the form of executable instructions. When the executable instructions are run by the set of processors 230, the set of processors 230 carry out the operations of the software constructs. Although certain software constructs are specifically shown and described herein, it is understood that the memory 240 typically includes many other software constructs, which are not shown, such as an operating system, various applications, processes, and daemons.

As further shown in FIG. 2, the memory 240 "includes," i.e., realizes by execution of software instructions, the above-mentioned yaw processor 172 and data structure 180, as well as extended Kalman filters 250 and a zero-velocity processor (ZVP) 260.

The extended Kalman filters (EKFs) 250 are configured to estimate and smooth measures of device orientation and motion in the presence of noisy inputs. In this example, extended Kalman filters are preferred over conventional ones, as extended Kalman filters are better at handling non-linearity, which is common in cases of rotational movement. In the example shown, the EKFs include an orientation-only EKF (OOEKF) 250a, a tracking EKF (TEKF) 250b, and a velocity EKF (VEKF) 250c. The OOEKF 250a is configured to receive values of local magnetic yaw 140a and to track orientation of the device 130 in its local magnetic FoR 108a, preferably tracking no other characteristics of the device 130, such as its position or velocity. Limiting the application of the OOEKF 250a to orientation-only promotes stable tracking of device orientation in the local magnetic FoR 108a. In addition to providing a filtered version of local magnetic yaw 140a, for purposes of yaw correction, the OOEKF 250a also provides input to the ZVP 260, e.g., to help determine a velocity state of the device 130.

The TEKF 250b is configured to receive values of reference yaw 140b, as well as IMU input, and to track both orientation and location of the device 130 in the spatial FoR 108b. The TEKF 250b provides a processed version of reference yaw values 140b for performing yaw correction. It also provides estimates of full device orientation (e.g., yaw, pitch, and roll) and device locations 192, which inform the server 170 as to the locations 192 at which offsets 190 are to be stored and/or retrieved.

The VEKF 250c is configured to track the full pose (position and orientation) of the device 130 in the local magnetic FoR 108a. In an example, the VEKF 250c performs no direct role in yaw measurement but is rather relevant to determination of velocity state, which is described more fully in Section II.

Shown to the right of FIG. 2 are further example details of the data structure 180. Here, data structure 180 may be arranged as a spatial data structure, e.g., as one that provides a respective index for each spatial dimension, such as X, Y, and Z, which may correspond to the dimensions of the WCS. Arranging the data structure 180 in this manner promotes fast lookups and provides a simple basis for locating neighbors, e.g., for purposes of averaging offset values.

As shown at the bottom-right of FIG. 2, each element of the data structure 180 may include the computed offset 190 for the respective location, as well as a count 190a and a timestamp 190b. In an example, the count 190a stores the number of offset values that have been averaged together to produce the respective offset 190. The timestamp 190b reflects the time of last update of the respective offset 190.

The data structure 180 may represent the space 102 at any desired level of granularity, such as 10-cm cubes, 1-cm cubes, and so forth, limited only by the stability of the WCS. In some examples, the data structure 180 is arranged hierarchically, with cubes representing regions and each region including multiple elements. Many variations are contemplated.

FIG. 3 shows certain features of the HMD 120 in additional detail. As shown, HMD 120 includes the above-described depth camera 122, as well as a wireless interface 310 (e.g., Wi-Fi and/or Bluetooth), an IMU 320, a set of processors 330, and memory 340. The memory 340 may include a SLAM (Stabilization, Localization, and Mapping) system 350 and a reference yaw generator 360. The SLAM system 350 is configured to locate and orient the HMD 120 in space, e.g., based on inputs from the depth camera 122 and IMU 320. The reference yaw generator 360 is configured to analyze images of the device 130, as acquired by the depth camera 122, to apply computer-vision techniques to determine the yaw direction of the device 130 relative to a local FoR of the HMD 120, and to transform that yaw direction into values of reference yaw 140*b* relative to the spatial FoR 108*b*. The processor(s) 330 and memory 340 form control circuitry, which is constructed and arranged to carry out the functions of the SLAM system 350 and reference yaw generator 360.

FIG. 4 shows certain features of the device 130 in additional detail. As shown, device 130 includes a wireless interface 410 (e.g., Wi-Fi and/or Bluetooth), an IMU 420, a set of processors 430, and memory 440. The IMU 420 includes a magnetic sensor 422, such as a magnetometer, and the memory 440 includes a local yaw generator 450. The local yaw generator 450 is configured to receive input from the magnetic sensor 422 and to produce values of local magnetic yaw 140*a*. The processor(s) 430 and memory 440 form control circuitry, which is constructed and arranged to carry out the functions of the local yaw generator 450. The device 130 may also include markings 136, as were introduced in FIG. 1.

Figure 5:
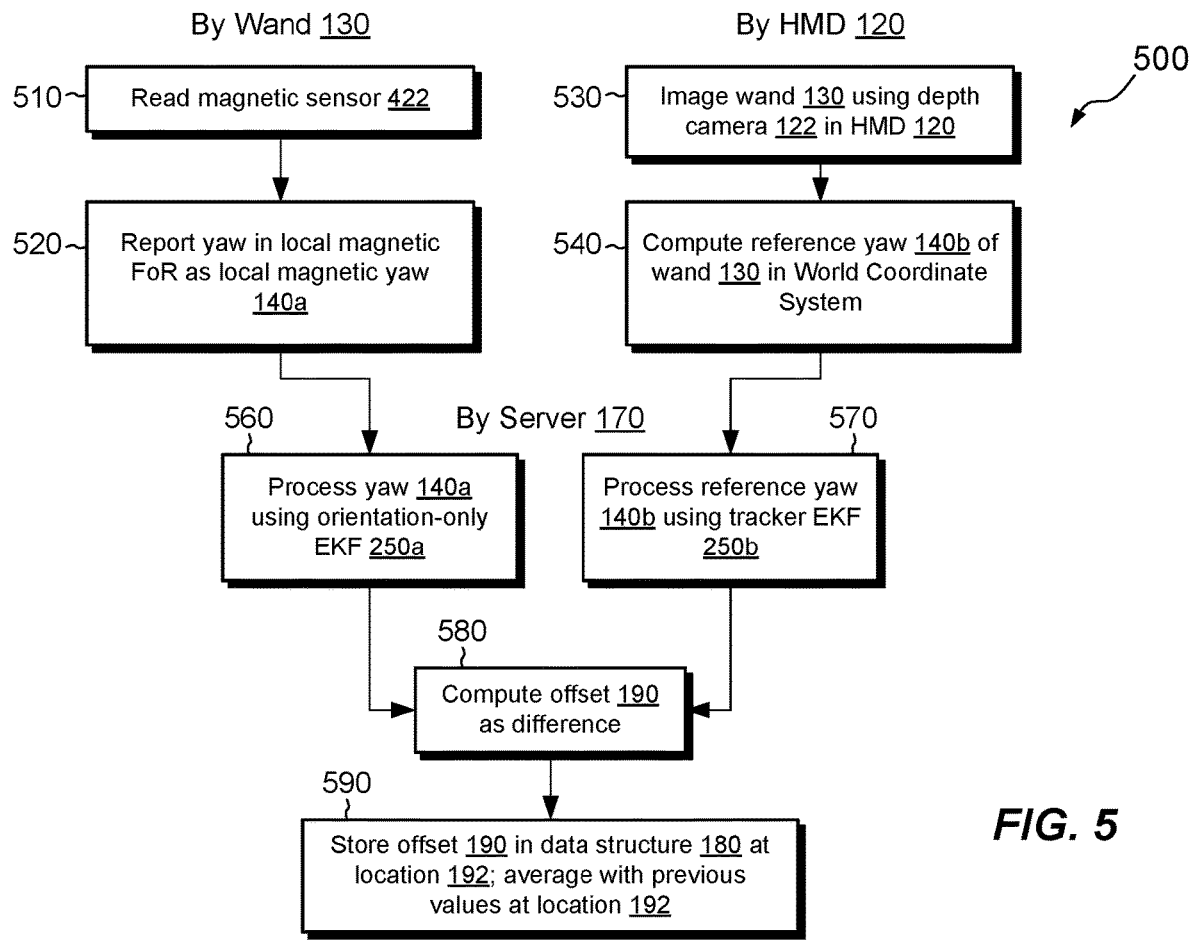
FIG. 5 is a flowchart showing an example method of generating an offset that represents a difference between a spatial direction of a device and a local magnetic field direction as reported by the device.

FIG. 5 shows an example method 500 for generating yaw offset values and involves activities performed by the device 130, the HMD 120, and the server 170. Although the acts of method 500 are shown in a particular order, the order shown is merely an example, as the method 500 may be performed in orders different from that shown, which may include performing some acts simultaneously.

At 510, the device 130 (e.g., the "wand") obtains its yaw direction relative to local magnetic north as detected by the magnetic sensor 422. At 520, the local yaw generator 450 in the device 130 processes the input from the magnetic sensor 422 and generates a measure 140*a* of local magnetic yaw, which it reports to the server 170. The measure 140*a* of local magnetic yaw is referenced to the local magnetic FoR 108*a*, which is based on the device's own measure of magnetic north and on its observed direction of gravity, e.g., as read by its IMU 420.

At or about the same time that the device 130 is performing these functions, the HMD 120 performs corresponding functions 530 and 540. At 530, the HMD 120 images the device 130 using the depth camera 122. At 540, the reference yaw generator 360 computes the reference yaw 140*b* of the device 130 in the spatial FoR 108*b*.

At 560, the server 170 receives the local magnetic yaw 140*a* and processes the local magnetic yaw 140*a* using the OOEKF 250*a*. Likewise, at 570 the server 170 receives the reference yaw 140*b* and processes the reference yaw 140*b* using the TEKF 250*b*. At 580, the server 170 computes the offset 190, e.g., as the difference between the processed versions of the reference yaw 140*b* and the local yaw 140*a*.

At 590, the server 170 stores the newly computed offset 190 in the data structure 180, e.g., in an element of the data structure 180 that corresponds to the X-Y-Z location of the device 130 when the acts 510 and 530 were performed. If an offset value is already present in this element of the data structure 180, the server 170 updates the current offset to reflect an average of the current offset with the new one, optionally weighting the average as described above.

Figure 6:
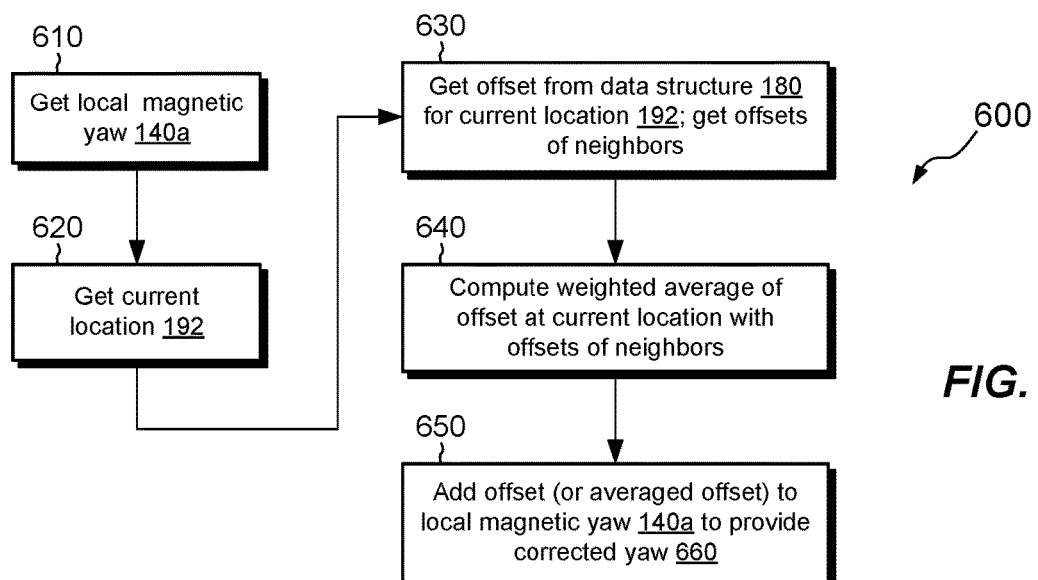
FIG. 6 is a flowchart showing an example method of applying an offset, such as the offset generated in FIG. 5, to correct a pointing direction of a device given the direction of the local magnetic field as reported by the device.

FIG. 6 shows an example method 600 for applying offset values stored in the data structure 180. As above, the order shown is merely illustrative and should not be construed as limiting.

At 610, device 130 reads its magnetic sensor 422 in the IMU 420 and provides a measurement of local magnetic yaw 140*a*.

At 620, the server 170 provides a current location 192 of the device 130. For example, the TEKF 250*b* tracks the location of the device 130 based on input from the HMD 120, IMU 420, data structure 180, and ZVP 260, computing each next location based at least in part on the current one.

At 630, the server 170 performs a lookup into the data structure 180, e.g., using the current location 192 as X-Y-Z indices, and obtains the offset 190 at the specified location. In some examples, the server 170 also obtains offset values from neighboring locations, e.g., at adjacent indices or regions in the data structure 180.

At 640, the server 170 computes a weighted average of offsets, which includes the offset at the current location and the offsets of its neighbors. This act may be skipped if averaging is not performed.

At 650, the server 170 adds the offset, which may be averaged, to the local magnetic yaw 140*a* obtained at 610, to provide a corrected yaw direction 660. Such addition may be accomplished, for example, by operation of the TEKF 250*b*, which may apply the yaw offset in a measurement function to enable the TEKF 250*b* to track the device 130 in the spatial FoR 108*b*. With the corrected yaw direction 660 in hand, the server 170 can accurately orient the device 130 in yaw, such that any virtual rays 132 from the device 130 align with the axis 138 of the device 130, thereby enabling the device 130 to be used as an accurate pointer.

Figure 7:
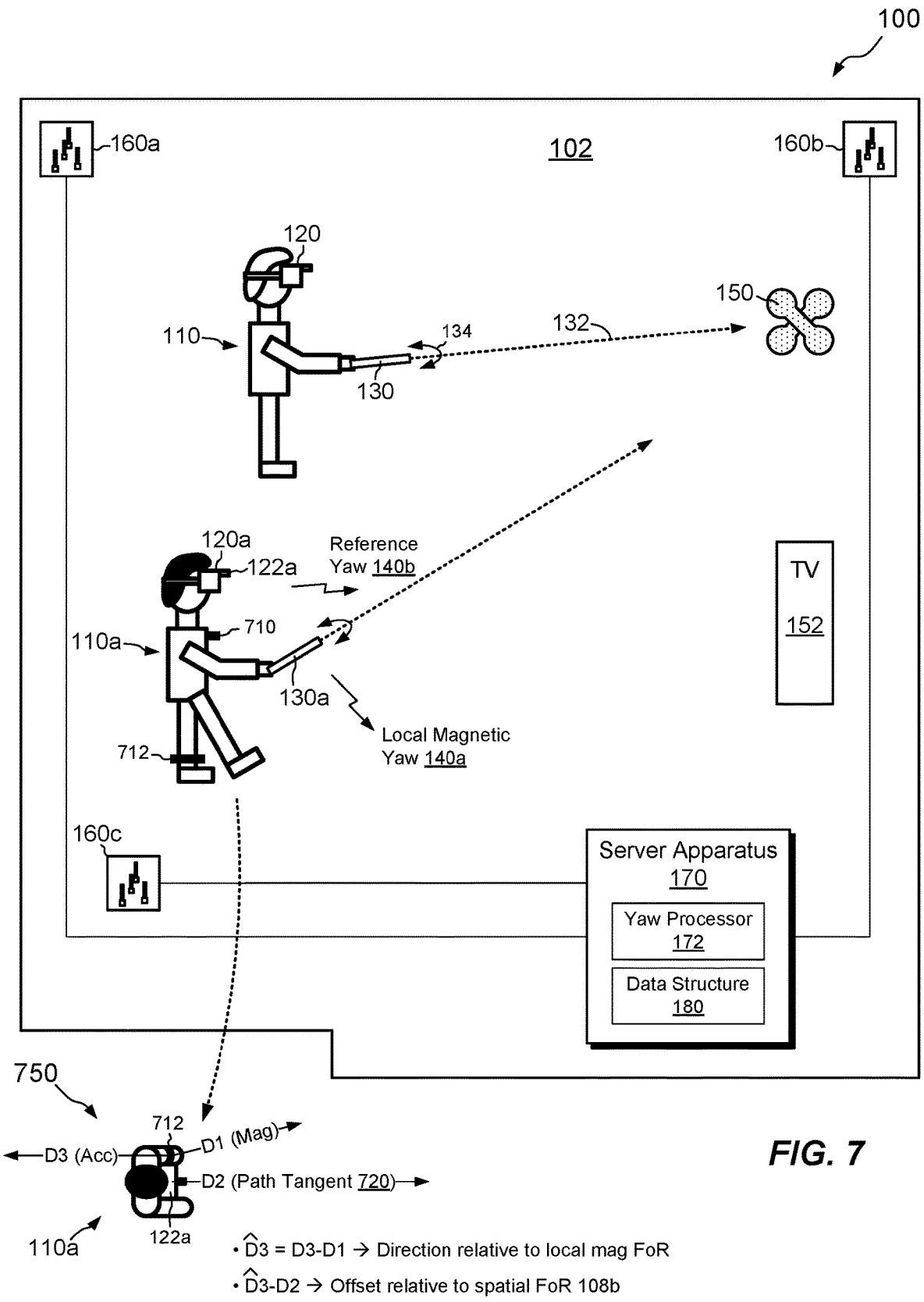
FIG. 7 is a block diagram of the example environment of FIG. 1, further showing a sharing of offsets among devices and/or users.

FIG. 7 shows an arrangement similar to that of FIG. 1, but here the user 110 shares the space 102 with a second user 110*a*. The second user 110*a* wears an HMD 120*a*, which may have its own depth camera 122*a*, and carries a device 130*a*, which may be similar to the device 130. In the example shown, the second user 110*a* is outfitted with additional devices, such as a chest sensor 710 and an ankle sensor 712. Each of these sensors 710 or 712 may have its own Wi-Fi interface and its own IMU, which includes a magnetic sensor, gyroscopes, and/or accelerometers. The sensors 710 and 712 may thus have similar capabilities in relevant respects to the devices 130 and 130*a*. For example, each sensor or device may be capable of generating its own measures of local magnetic yaw 140*a*. Unlike the devices 130 and 130*a*, however, the sensors 710 and 712 may not easily be visualized using the depth camera 122*a*. Accordingly, sensors 710 and 712 may be consumers of offsets 190 in the data structure 180 but need not be providers of offsets, as there may be no yaw references 140*b* to be used for comparison. The sensors 710 and 712 may still benefit from yaw correction, however, by applying offsets 190 already stored in the data structure 180 to their own measurements of local magnetic yaw direction 140*a*.

One should appreciate that yaw offsets 190 are not specific to any device or user, but rather are applicable to any device operated by any user. As the magnetic field 104 is quasi-stationary, offsets generated for one device may be applied to any other device. Rather than reflecting properties of devices, the offsets 190 are intended to reflect properties of the space 102, which may be accessed for correction by any device that uses a magnetic field to orient itself.

Just as consumers of offsets 190 need not also be providers of offsets, neither do providers of offsets also need to be consumers. Some devices or sensors may be both providers and consumers, however.

In some examples, the server 170 infers the pointing direction of a device or sensor from other devices or sensors. For example, knowledge of normal body mechanics may be applied to draw inferences about sensor orientation.

Consider a case where user 110a is walking forward (to the right in the perspective of the figure). It may be possible to infer the yaw direction of the chest sensor 710 and/or ankle sensor 712 based on a known yaw direction of movement of the user 110a. The server 170 may determine this yaw direction based on input from the HMD 120a and/or device 130a. The server 170 may then apply that direction of movement, which we call a "path tangent" 720, as a reference for other sensors. For example, the path tangent 720 may serve as a reference yaw 140b, e.g. for the chest sensor, given that it provides an independent measure of yaw direction in the WCS FoR 108b. In some examples, the server 170 generates new offsets based on path tangents 720, which it applies as measures of reference yaw 140b, and on local magnetic yaw 140a as measured in the local magnetic FoR of the respective device. Operation proceeds in a similar manner to that shown in FIG. 5, except that path tangents 720 are used as sources of reference yaw 140b rather than images from the depth camera.

A top view 750 of user 110a (bottom of FIG. 7) shows another example use of path tangent 720. Here, it may be desired to provide an accurate measure of yaw direction of the ankle sensor 712, which is not easily visualized by the depth camera 122a. To this end, the server 170 may estimate a current path tangent 720 (D2) from chest sensor 710 or HMD 120a. At or about the same time, the accelerometer in the angle sensor 712 may indicate a direction D3, based on the direction of force applied by the user's ankle, and may further generate a local magnetic yaw 140a, having direction D1. The server 170 may then calculate a direction $\overline{D3}$ relative to the local magnetic FoR of the ankle sensor 712, and then subtract D2 to produce an offset 190 of the ankle sensor 712 in the spatial FoR 108b.

Figure 8:
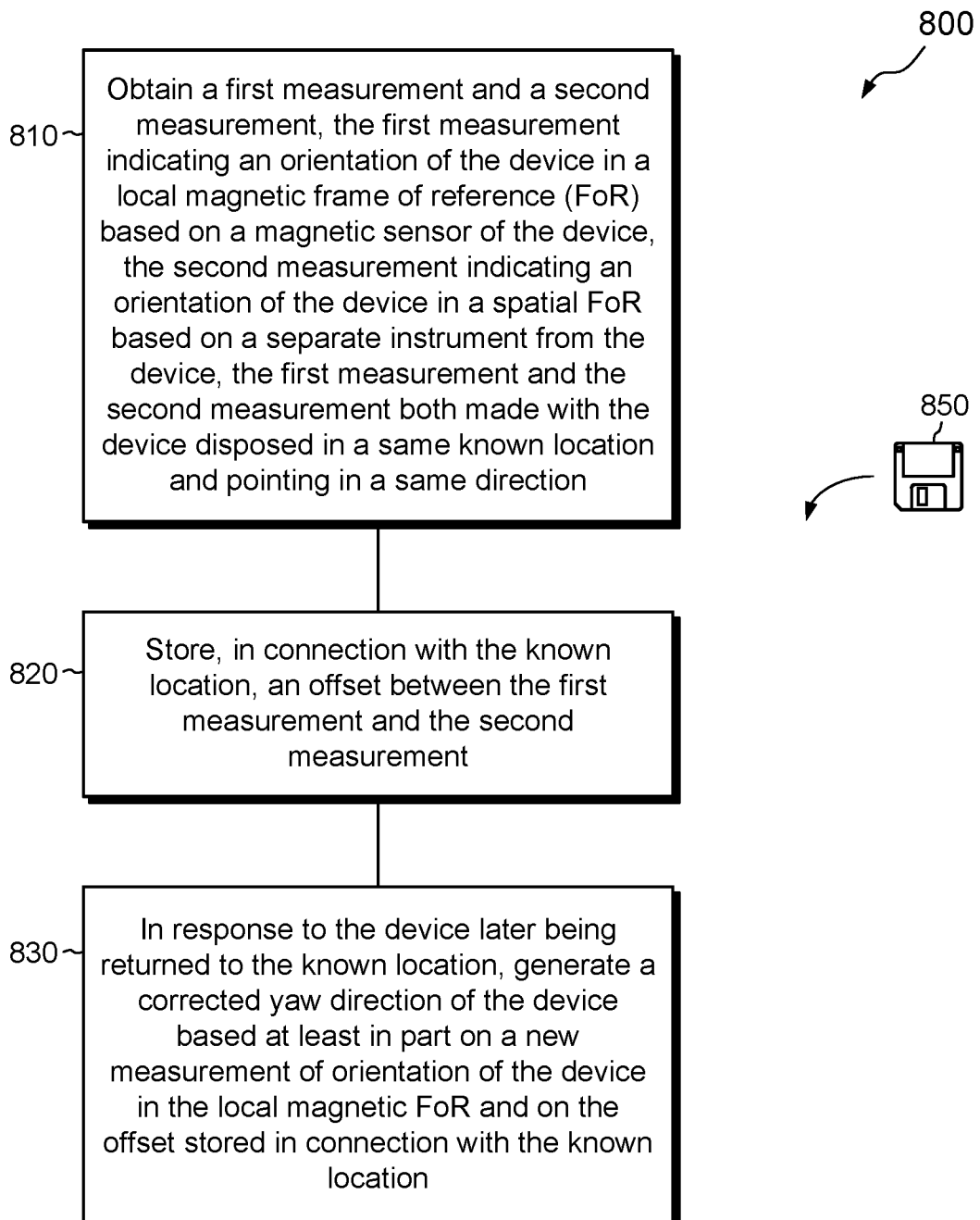
FIG. 8 is a flowchart showing an example method of measuring a yaw direction of a device in a space.

FIG. 8 shows an example method 800 that may be carried out in connection with the environment 100 and summarizes some of the features described above. The method 800 is typically performed, for example, by the software constructs described in connection with FIGS. 2-4. The various acts of method 800 may be ordered in any suitable way. Accordingly, embodiments may be constructed in which acts are performed in orders different from that illustrated, which may include performing some acts simultaneously.

At 810, a first measurement 140a and a second measurement 140b are obtained. The first measurement 140a indicates an orientation of a device 130 in a local magnetic frame of reference (FoR) 108a based on a magnetic sensor 422 of the device 130, and the second measurement 140b indicates an orientation of the device 130 in a spatial FoR 108b based on a separate instrument from the device 130, such as a depth camera 122 or path tangent of HMD 120. The first measurement 140a and the second measurement 140b are both made with the device 130 disposed in the same known location 192 and pointing in the same direction.

At 820, an offset 190 between the first measurement 140a and the second measurement 140b is stored in connection with the known location 192, e.g., as an element in the data structure 180.

At 830, in response to the device 130 later being returned to the known location, a corrected yaw direction of the device 130 is generated based at least in part on a new measurement 140a of the orientation of the device 130 in the local magnetic FoR and on the offset 190 stored in connection with the known location 192.

An improved technique has been described for measuring yaw of a device 130. The technique includes obtaining a first measurement 140a of an orientation of the device relative to a local magnetic FoR and a second measurement 140b of the orientation of the device 130 relative to a spatial FoR, with both measurements made while the device is disposed at a known location and in the same orientation. The technique computes an offset 190 between the two measurements and stores the offset in connection with the known location 192. When the device 130 is later returned to the known location, the yaw direction 660 of the device is determined based on acquiring a new measurement 140a of the device's orientation in the local magnetic FoR 108a and applying the offset 190 as a correction.

Having described certain embodiments, numerous alternative embodiments or variations can be made. For example, although certain functions have been described as being performed by the server 170, this description is illustrative rather than limiting, as the same functions could be performed by the HMD 170 (acting as the server) or in some other component. Although the server 170 is shown as a single component, one should appreciate that the server 170 may be implemented with any number of computers and that at least some of the computers need not be local.

Section II: Device Velocity State Detection

This section presents an improved technique for detecting a velocity state of a device, such as whether the device is moving, at rest, or at a dead stop. Embodiments of the technique presented herein may be practiced in the environment of Section I but do not require yaw measurements as described in Section I. The improvements of Section I and Section II may each benefit from the other. For example, detection of an at-rest state of a device may promote accuracy when generating yaw offsets 190. Similarly, detection of a change in yaw may alert the ZVP 260 (FIG. 2) that a device that was previously in the dead-stop state is now in motion. Particular features described as required for yaw measurement may be optional for at-rest detection, and vice-versa. Therefore, a statement that any element is required in one section should not be taken to mean that the same element is necessarily required in the other section.

As described herein, an improved technique for detecting a velocity state of a device includes generating multiple phase measurements for each of multiple packets emitted by the device and monitoring differences between phase measurements made for different packets. The technique further includes asserting a particular velocity state of the device based on a condition of the monitored differences. In some examples, detecting the particular velocity state of the device can trigger a correction for IMU drift.

Figure 9:
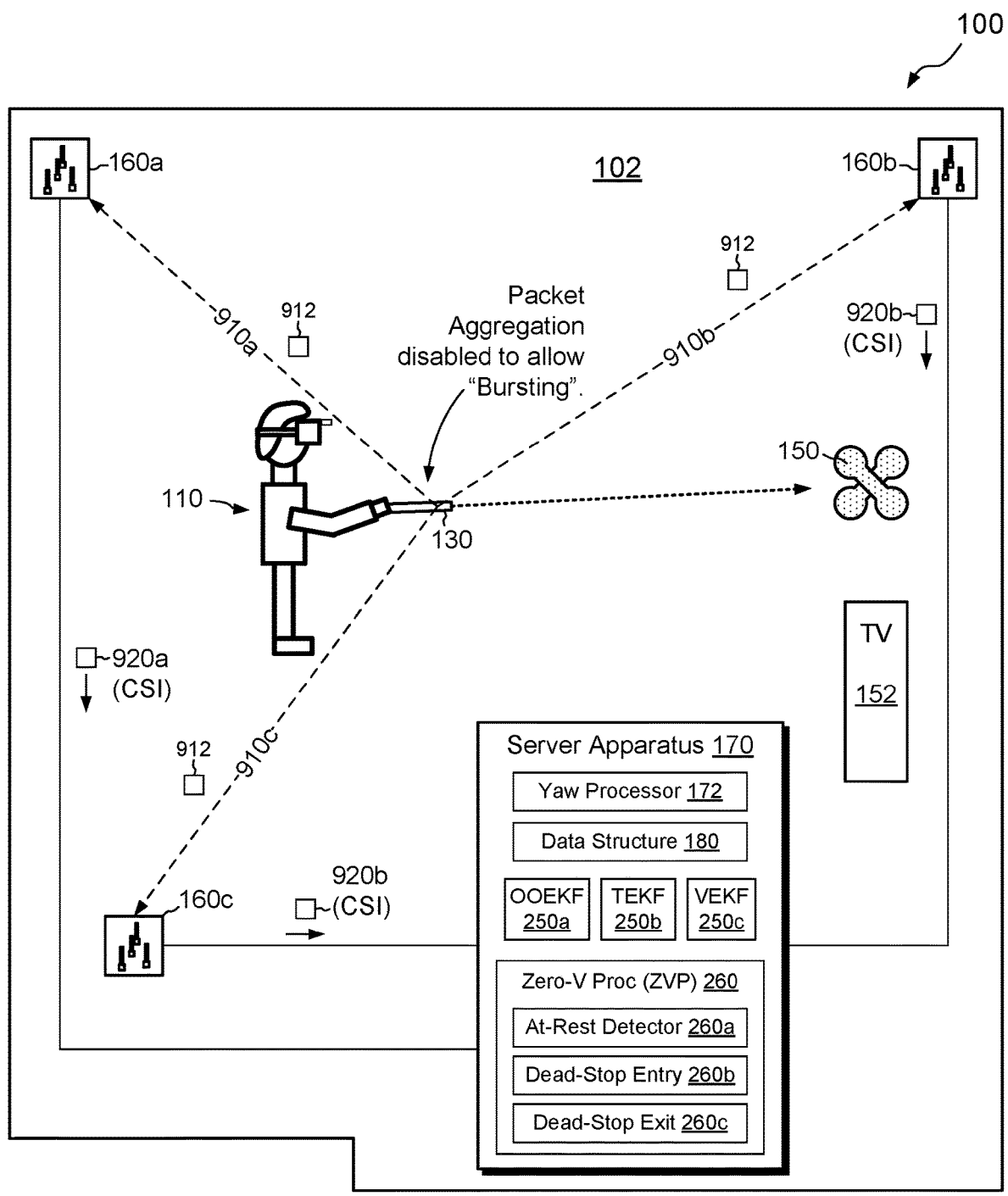
FIG. 9 is a block diagram of the example environment of FIG. 1, further showing a detection of an at-rest state of a device based at least in part on signals emitted by the device.

FIG. 9 shows the example environment 100 of FIG. 1, with particular features emphasized to depict aspects of velocity state detection. In example operation, the user 110 holds the device 130, and the device 130 emits packets, such as Wi-Fi packets. The packets travel through space 102 and impinge upon antenna arrays 160. For example, a packet 912 may traverse paths 910*a*, 910*b*, and 910*c* to antenna arrays 160*a*, 160*b*, and 160*c*, respectively. Although shown as following simple paths, the packet 912 spreads out from device 130 in all directions and typically follows many paths to each antenna array 160. Multipath effects arise from reflections from walls, ceilings, floors, furniture, and so forth, and can be quite complex. Typically, each antenna of each antenna array 160 receives the packet 912, and associated processing circuitry generates CSI (Channel State Information). The CSI typically contains information about the multipath signal received, such as its phase. Each antenna array 160, in response to receiving a packet, sends the CSI 920*a*, 920*b*, or 920*c* of its constituent antennas to the server 170, where the ZVP 260 analyzes changes in the CSI across different packets and determines a velocity state of the device 130. Typically, each antenna sends respective CSI, such that an antenna array 160 having four antennas sends four sets of CSI.

Continuing with reference to FIG. 9, the ZVP 260 is configured to track velocity of the device 130, assigning the device 130 to one of the following velocity states:

A Moving State, which indicates that the device 130 is in motion;

An At-Rest State, which indicates that the device 130 is either stopped or nearly stopped; and A Dead-Stop State, which indicates that the device is at a complete stop.

The dead-stop state may be regarded as a sub-state of the at-rest state, as a device that is at a dead-stop is also at rest. The two states differ in their degree of certainty, however, with the dead-stop state indicating a higher degree of certainty that the device is at a complete stop than the at-rest state. To track the state of the device 130, the ZVP 260 includes an at-rest detector 260*a*, a dead-stop entry assessor 260*b*, and a dead-stop exit assessor 260*c*. The at-rest detector 260*a* is configured to determine whether the device 130 is in the moving state or the at-rest state. The dead-stop entry assessor 260*b* is configured to detect when the dead-stop state has been entered. Both the at-rest detector 260*a* and the dead-stop entry assessor 260*b* operate primarily (and in some cases solely) based on Wi-Fi signals emitted from the device 130, optionally receiving additional input from the HMD 120, the OOEKF 250*a*, and/or the VEKF 250*c*. The dead-stop exit assessor 260*c* is configured to detect when the dead-stop state has been exited, i.e., when it can no longer be determined with a sufficiently high level of confidence that the device 130 is at a true dead stop. The dead-stop exit assessor 260*c* preferably takes input from all relevant sources, including Wi-Fi, HMD 120, IMU 420, and EKFs 250*a* and 250*c*.

Although the environment 100 shows three antenna arrays 160*a*, 160*b*, and 160*c*, the at-rest detector 260*a* may work effectively with as few as one antenna array 160. Performance may improve, however, with additional antenna arrays 160, and three antenna arrays 160 appear to be optimal in most cases. Preferably, each antenna array 160 includes multiple antennas.

Figure 10:
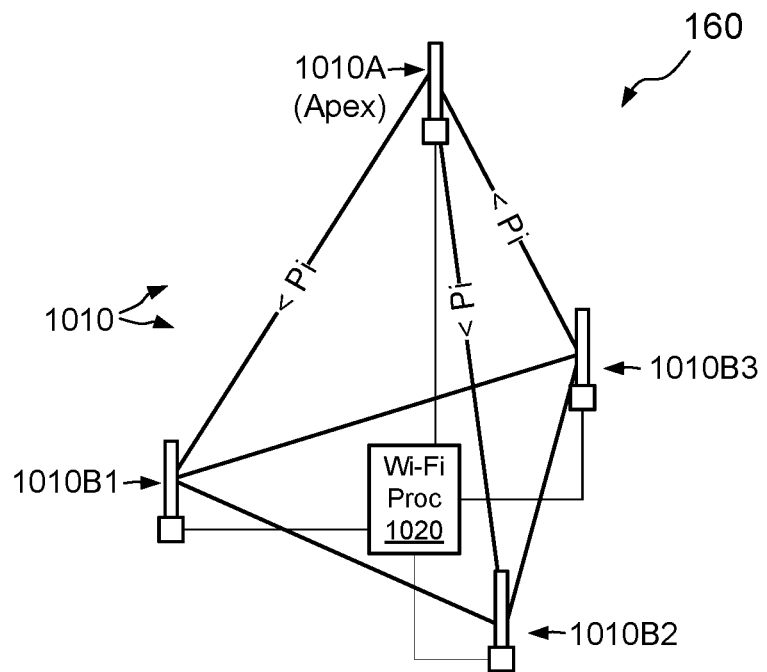
FIG. 10 is a perspective view of an example antenna array of FIG. 9.

FIG. 10 shows an example antenna array 160 in additional detail. The antenna array 160 may be representative of antenna arrays 160*a*, 160*b*, and 160*c*. The antenna array 160 is seen to include an apex antenna 1010A and multiple base antennas 1010B1, 1010B2, and 1010B3. Other numbers of base antennas may be used. The antennas 1010 are preferably spaced apart such that the distance between the apex antenna 1010A and each of the base antennas is less than Pi radians at Wi-Fi frequency. Assuming 5 GHz Wi-Fi signals, Pi radians works out to approximately 3 cm. Thus, the maximum distance between the apex antenna 1010A and each base antenna is preferably less than 3 cm. The actual distance is preferably barely less than 3 cm, however, as making the distance much smaller might cause interference between antennas and degrade measurement accuracy. The distance between different base antennas is not critical, but it is preferably on the same order. Also shown in FIG. 10 is a Wi-Fi processor 1020. The Wi-Fi processor 1020 uses a common reference clock for generating CSI for all of the antennas 1010. For example, Wi-Fi processor 1020 includes a 4×4 Wi-Fi chip capable of handling the four antennas. Use of a common clock prevents device-frequency errors from arising between antennas 1010 in array 160. No effort need be made to synchronize clocks across antenna arrays 160, however. One should appreciate that the terms "apex" and "base" are merely names that facilitate description and that different terms may be used for different types of antenna arrays.

Figure 11:
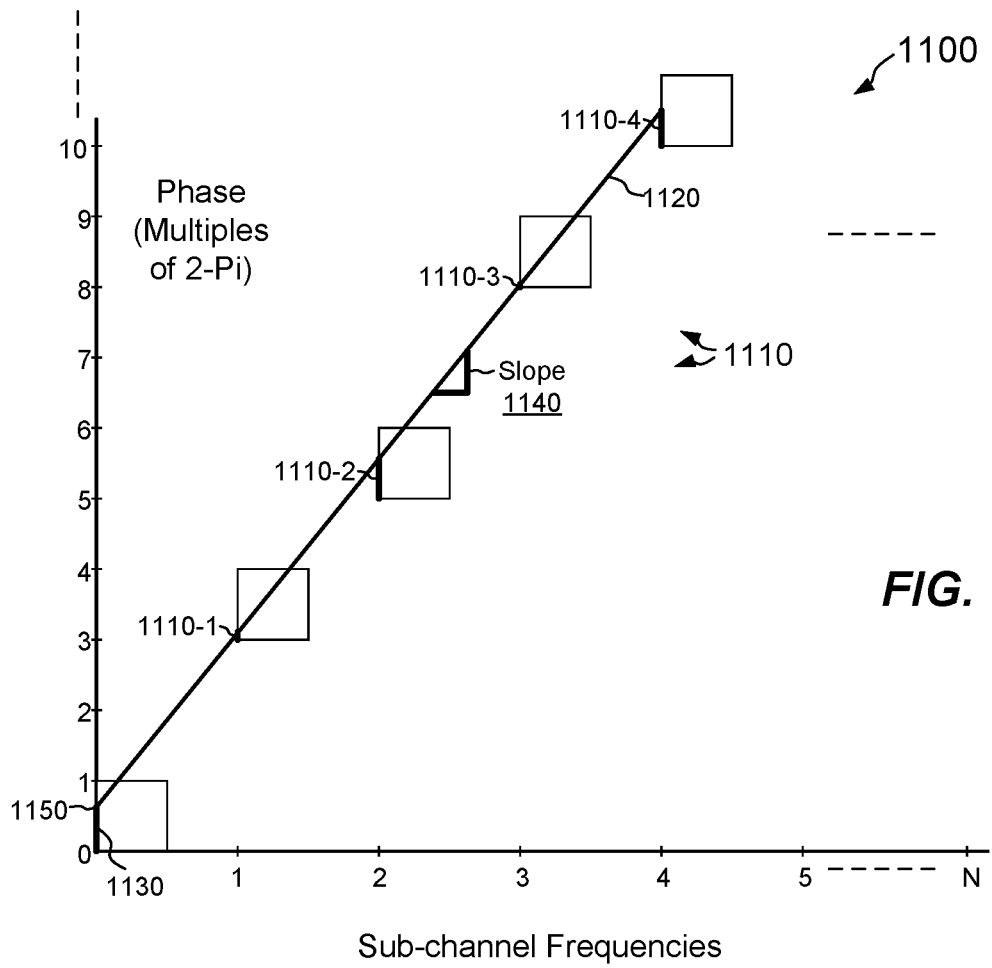
FIG. 11 is a graph of unwrapped CSI (Channel State Information) phase, as derived from any of the antennas in the antenna array of FIG. 10.

FIG. 11 shows an example graph 1100 of unwrapped CSI phase versus sub-channel frequency. In an example, data of the graph 1100 is generated by Wi-Fi processor 1020 in an antenna array 160 in response to one of its antennas 1010 receiving a wireless packet. In an example, the CSI of each antenna 1010 forms the basis for a respective graph 1100. The graph 1100 shows phase as measured by multiple Wi-Fi sub-channels, which are labeled 1-N, where "N" is the number of sub-channels. Some implementations represent sub-channels from −N/2 to N/2. This is merely a convention. Multiple phase measurements 1110-1 through 1110-4 (collectively, 1110) are shown, with the line in each illustrated square representing a phase measurement. A phase 1130 of the 0-th sub-channel is not directly measured but is rather inferred from other phase data.

It can be seen that the unwrapped CSI phase has a slope 1140 and a y-intercept 1150. The slope 1140 corresponds to the integer part of a number of wavelengths traveled by the Wi-Fi signal from the device 130 to the antenna 1010. The y-intercept 1150 corresponds to the fractional part of the number of wavelengths traveled. Thus, the slope 1140 provides a course measure of distance traveled, whereas the y-intercept 1150 provides a fine measure of distance traveled. The y-intercept 1150 may vary between 0 and 2-Pi radians (or equivalently, between −Pi and +Pi radians).

Our experiments have shown that neither the slope 1140 nor the y-intercept 1150 of the unwrapped CSI phase is consistent from one packet to the next, even when distances are kept constant. The slope changes on account of variable packet-detection delays found in commercially-available Wi-Fi devices, whereas the y-intercept changes on account of device-frequency offset. However, we have recognized that differences in y-intercepts 1150 as measured between different antennas 1010 of an antenna array 160 still provide useful information for detecting whether a device is moving or at rest.

Figure 12A:
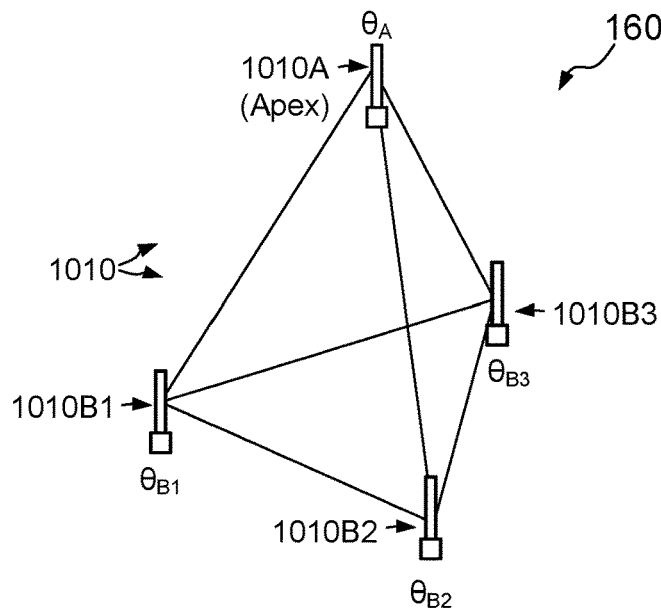
FIGS. 12a and 12b respectively show another perspective view of the antenna array of FIG. 10 and a flowchart showing a method of processing CSI phase to detect an at-rest condition of a device.
Figure 12B:
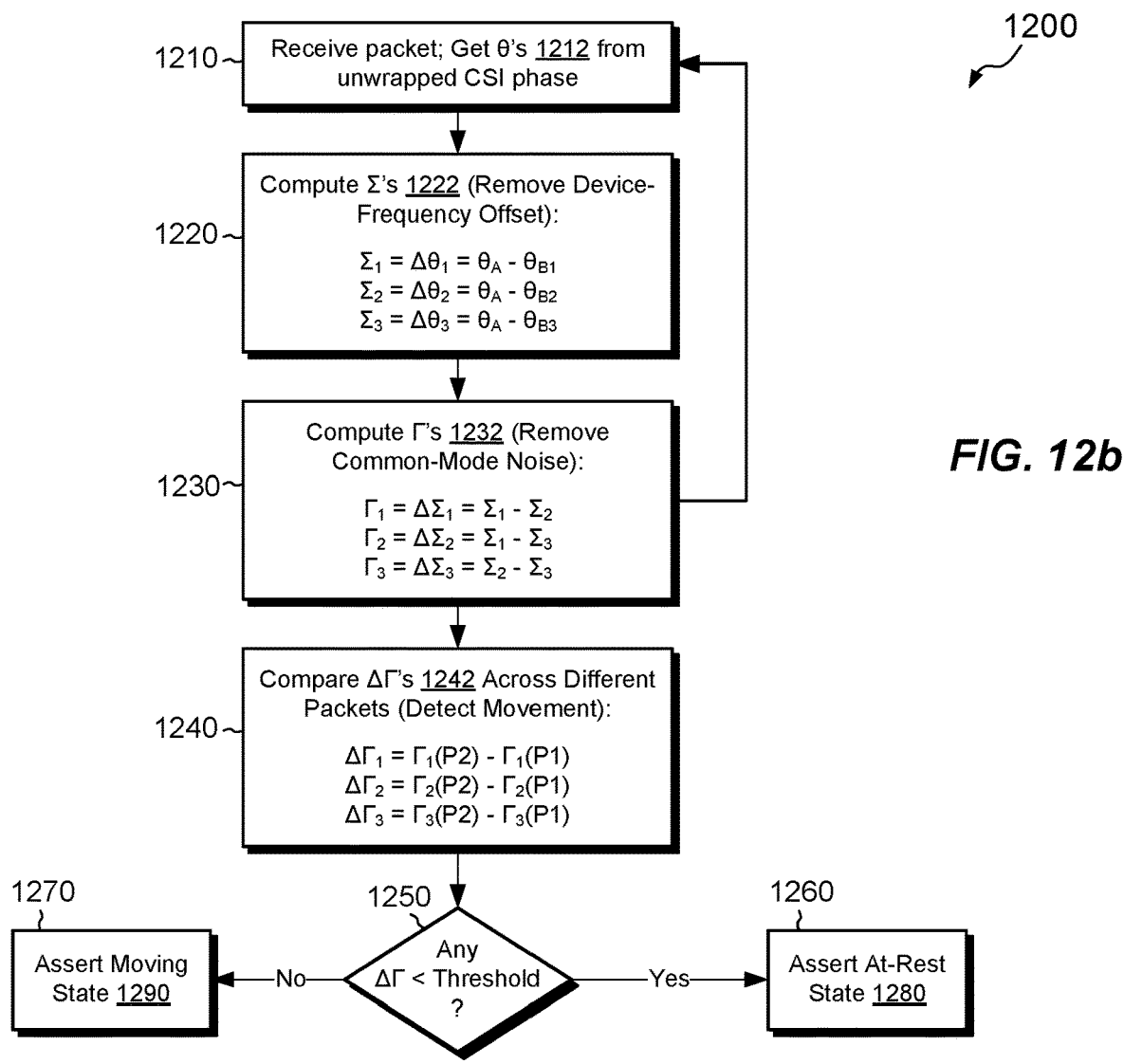

FIGS. 12*a* and 12*b* show an example arrangement for detecting a velocity state of a packet-emitting device based on measurements of CSI phase by an antenna array 160. FIG. 12*a* shows an example antenna arrangement, and FIG. 12*b* shows an example method 1200. The at-rest detector 260*a* typically performs the method 1200, with help from one or more antenna arrays 160, to effectively determine whether the device 130 is in the at-rest state or the moving state.

At 1210 of FIG. 12*b*, the antenna array 160 receives a packet, and each of the antennas 1010 in antenna array 160 generates respective CSI for that packet. From the CSI of each antenna 1010, a respective y-intercept 1150 is identified, e.g., from the respective unwrapped CSI phase. We refer to each y-intercept as a "theta" ($\Theta$), with $\Theta_A$ (FIG. 12a) being the y-intercept derived from apex antenna 1010A and $\Theta_{B1}$ through $\Theta_{B3}$ being the y-intercepts of the respective base antennas 1010B1 through 1010B3.

At 1220, the server 170 computes values of delta-theta ($\Delta\Theta$) as differences between $\Theta_A$ of the apex antenna 1010A and each of the $\Theta_B$'s, as shown. The results are three $\Delta\Theta$'s, which we call "sigmas" ($\Sigma$'s), e.g., $\Sigma_1$, $\Sigma_2$, and $\Sigma_3$. By computing each $\Delta\Theta$ (or $\Sigma$) value, the server 170 acts to remove device-frequency offset, i.e. slight differences in Wi-Fi frequencies between the packet-emitting device and the antenna array 160. We may assume that all antennas 1010 in any antenna array 160 share a common reference clock, although clocks between antenna arrays may differ. Values of $\Sigma$ are thus corrected for device-frequency offset.

At 1230, common-mode noise is removed by computing differences between $\Sigma$ values. For example, providing three $\Sigma$ values ($\Sigma_1$, $\Sigma_2$, and $\Sigma_3$) means that there are three unique pairs of $\Sigma$ values, $\{\Sigma_1, \Sigma_2\}$, $\{\Sigma_1, \Sigma_3\}$, and $\{\Sigma_2, \Sigma_3\}$, which we can use as a basis for computing $\Delta\Sigma$'s. At 1230, we compute these three $\Delta\Sigma$ values, shown as $\Delta\Sigma_1$, $\Delta\Sigma_2$, and $\Delta\Sigma_3$. These $\Delta\Sigma$'s are also referred to herein as "gammas" ($\Gamma$'s) with act 1230 producing three $\Gamma$'s: $\Gamma_1$, $\Gamma_2$, and $\Gamma_3$. At the completion of 1230 (or in parallel therewith), operation returns to 1210, whereupon another packet is received and processed per acts 1210, 1220, and 1230.

Once two, preferably consecutive, packets from the device 130 have been processed, operation proceeds to 1240, whereupon the server 170 computes $\Delta\Gamma$'s between the two packets, P1 and P2. For example, $\Delta\Gamma_1$ is the difference between $\Gamma_1$ for packet P2 and $\Gamma_1$ for packet P1, and likewise for the other $\Delta\Gamma$'s. The packets P1 and P2 may be separated in time by approximately 20 milliseconds, a short-enough interval to allow small changes in velocity to be detected, but not so small that differences are unlikely to be detected. Other time intervals between packets may be used, however.

Operation next proceeds to 1250, whereupon the method 1200 tests whether any of the $\Delta\Gamma$'s computed at 1240 falls below a predetermined threshold. If so, at 1260 the device is at rest and the server 170 asserts the at-rest state 1280. If not, the at-rest detector may determine that the device is in the moving state 1290 (act 1270). In some examples, assertion of the at-rest state 1280 may be delayed until it is determined that at least one $\Delta\Gamma$ from among all those computed remains less than the threshold for some number of packets. As an example, a variable may be set to an initial value when the device is moving. The variable may be decremented for each packet that produces at least one $\Delta\Gamma$ below the threshold and may be incremented for each packet that produces no $\Delta\Gamma$ below the threshold. The variable may be limited between minimum and maximum values. With this scheme, the at-rest state 1280 is asserted when the variable reaches the minimum value.

It should be noted that the at-rest state 1280 may be asserted using only a single antenna array, as described above, but performance may improve by using additional antenna arrays 160. Should multiple antenna arrays 160 be used, acts 1210 through 1240 of the method 1200 may be performed for each of them. But rather than comparing, during act 1250, the $\Delta\Gamma$'s for a single antenna array 160 for detecting the at-rest state 1280, act 1250 instead looks across all antenna arrays 160. For example, assuming three antenna arrays 160 are used, if any of the resulting nine $\Delta\Gamma$'s computed across the three antenna arrays 160 is below the threshold, the device is considered to be at-rest, even if the threshold is exceeded by any or all of the other $\Delta\Gamma$'s across the antenna arrays 160. Making the at-rest decision in this fashion reflects the fact that movement of the device usually affects CSI as measured by all antenna arrays 160 by a relatively large amount, whereas movement of a person or object usually affects CSI as measured by only a subset of antenna arrays and to a lesser amount. If one or more of the $\Delta\Gamma$'s shows little or no change, then probably the disturbance is not caused by device motion.

Although the at-rest detector 260a is configured to determine whether the device 130 is moving or at rest, accumulated errors may cause the at-rest detector 260a to assert the at-rest state when the device 130 is moving very slowly. The at-rest detector 260a is particularly robust against noise and is expected to improve with additional variance tuning of the extended Kalman filters 250. Although not a perfect dead-stop detector, the at-rest detector 260a has been shown to produce an error of less than a few cm/sec (such as 7 cm/sec), using CSI-based techniques only. For purposes of at-rest detection, the device 130 is considered to be "at-rest" if it is stopped or moving at a velocity less than this speed.

Detection of the at-rest state confers significant benefits, even if it is not true dead-stop detection. For example, the server 170 may use the assertion of an at-rest state to trigger operation of the dead-stop entry assessor 260b, which is expected to detect a true dead-stop more reliably than the at-rest detector 260a. Also, detection of an at-rest state may allow the server 170 to adjust inputs to the extended Kalman filters 250, to best tailor their operation for current circumstances. For instance, the server 170 may apply a zero-velocity measurement function to the TEKF 250b in response to an at-rest detection and provide the TEKF with an increased variance, so as to reflect a lower level of confidence that the velocity is actually zero. When operating in the dead-stop state 1280, the server 170 may provide the same measurement function to the TEKF 250b, but with a very small variance, so as to reflect higher confidence that the velocity actually is zero. Both the TEKF 250b and the VEKF 250c may update their respective measurement functions each time the at-rest detector 260a detects the at-rest state 1280. In addition, and given that the TEKF 250b tracks device location, improving the accuracy of the TEKF 250b promotes more accurate measures of device location. In so doing, the ability to detect the at-rest state 1280 improves yaw measurements (Section I). The overall effect of at-rest detection is thus to leverage knowledge of zero or near-zero velocity to increase accuracy of both tracking and yaw measurements.

One should appreciate that any movement of the device 130 within the space 102 changes the CSI phase of signals received by the antenna arrays 160. Typically, device movement causes all path lengths and therefore all CSI phase values to change for all antenna arrays 160. In contrast, changes in the environment, e.g., caused by people or objects moving around, tend to affect CSI phase much more for some antenna arrays 160 than for others. For example, the antenna array 160 that is closest to the moving person or object is likely to be affected more than antenna arrays 160 that are further away, especially if the person or object is located between the device and the closest antenna array. Given this difference in phase behavior between a moving device and a moving person or object, the server 170 is able to differentiate between the two cases based on how CSI phase changes from the different antenna arrays 160. In particular, one can say whether the device 130 is merely at rest or has entered a dead-stop state by applying different thresholds for phase stability, as measured by the different antenna arrays 160.

In an example, the dead-stop entry assessor 260*b* (FIG. 9) receives the same delta-sigmas (ΔΣ's) that are used by the at-rest detector 260*a* in method 1200. Rather than analyzing differences in ΔΣ's between two consecutive packets, however, the dead-stop entry assessor 260*b* looks for stability in ΔΣ's over multiple consecutive packets, such as three or more packets, for example, which may arrive over an interval of 60 or more milliseconds (assuming 20-millisecond packet spacing). Preferably, the dead-stop entry assessor 260*b* looks at ΔΣ's from all antennas 1010 of all antenna arrays 160 that are in use, e.g., nine antennas 1010 for a three-array setup. In an example, the dead-stop entry assessor 260*b* uses a combination of deviation thresholds and voting to determine whether the device 130 should enter the dead-stop state. Accordingly, the dead-stop entry assessor 260*b* may work solely on the basis of Wi-Fi signals (CSI). However, some embodiments augment CSI with input from other sources, such as IMU 420, EKFs 250, and HMD 120.

Operation of the dead-stop exit assessor 260*c* is generally simpler than that of the dead-stop entry detector 260*b*, as any significant change in position or orientation of the device from any source (e.g., IMU 420, HMD 120, CSI, or yaw) can cause the device to exit the dead-stop state. Also, certain embodiments employ a more conservative standard for entering a dead-stop state than for exiting it. Given that some or all of the EKFs 250 may be tuned differently when the device 130 is in a dead-stop state than when it is in the other states, optimal performance may depend on not being wrong when declaring the dead-stop state. However, the consequences in terms of user experience of wrongly declaring that a device is not in the dead-stop state are typically less severe.

Given the reliance of certain embodiments on CSI for asserting the various states (moving, at-rest, and dead-stop), accurate performance may depend on the CSI being valid. In some examples, validity of CSI is verified through the use of packet bursting. For example, Wi-Fi settings of the device 130 may be configured to disable packet aggregation and therefore to permit packet bursting. Enabling or disabling aggregation is typically a device-driver setting of the Wi-Fi component, but details of the setting may vary across manufacturers. We have experimented successfully with disabling packet aggregation using Wi-Fi devices obtained from Laird Technologies, Inc., of Chesterfield, Mo. By disabling Wi-Fi packet aggregation, the device 130 is able to send separate packets in very quick succession, on the order of once every 200 microseconds. In an example, all the packets within each burst carry the same payload. Bursting thus provides redundancy at high speed, which enables the ZVP 260 to operate more robustly. Different bursts, conveying different payloads, may be sent approximately every 20 milliseconds.

We have recognized that multipath characteristics of the space 102 are unlikely to change by measurable amounts within the span of a single burst, which may last only a few hundred microseconds or less. The space 102 typically remains stable within that timeframe. Any large change in CSI within a burst then almost certainly indicates a hardware error or other anomaly. If a burst contains two packets for which CSI differs by more than a threshold amount, the server 170 may compare the CSI of the two packets with the CSI of a packet from an immediately previous burst. If the CSI of one of the two packets from the current burst matches the CSI of the packet from the previous burst to within a threshold difference, the other of the two packets from the current burst is discarded as erroneous. If the CSI of both packets of the current burst differs from the CSI of the packet from the previous burst by more than a threshold, all the packets of the current burst may be discarded. Discarding packets that convey erroneous CSI prevents that CSI from degrading the quality of velocity-state detection. In an example, the CSI features that are the subject of the above-described comparison are the delta-sigma (ΔΣ) values, as described in connection with FIG. 12*b*.

Figure 13:
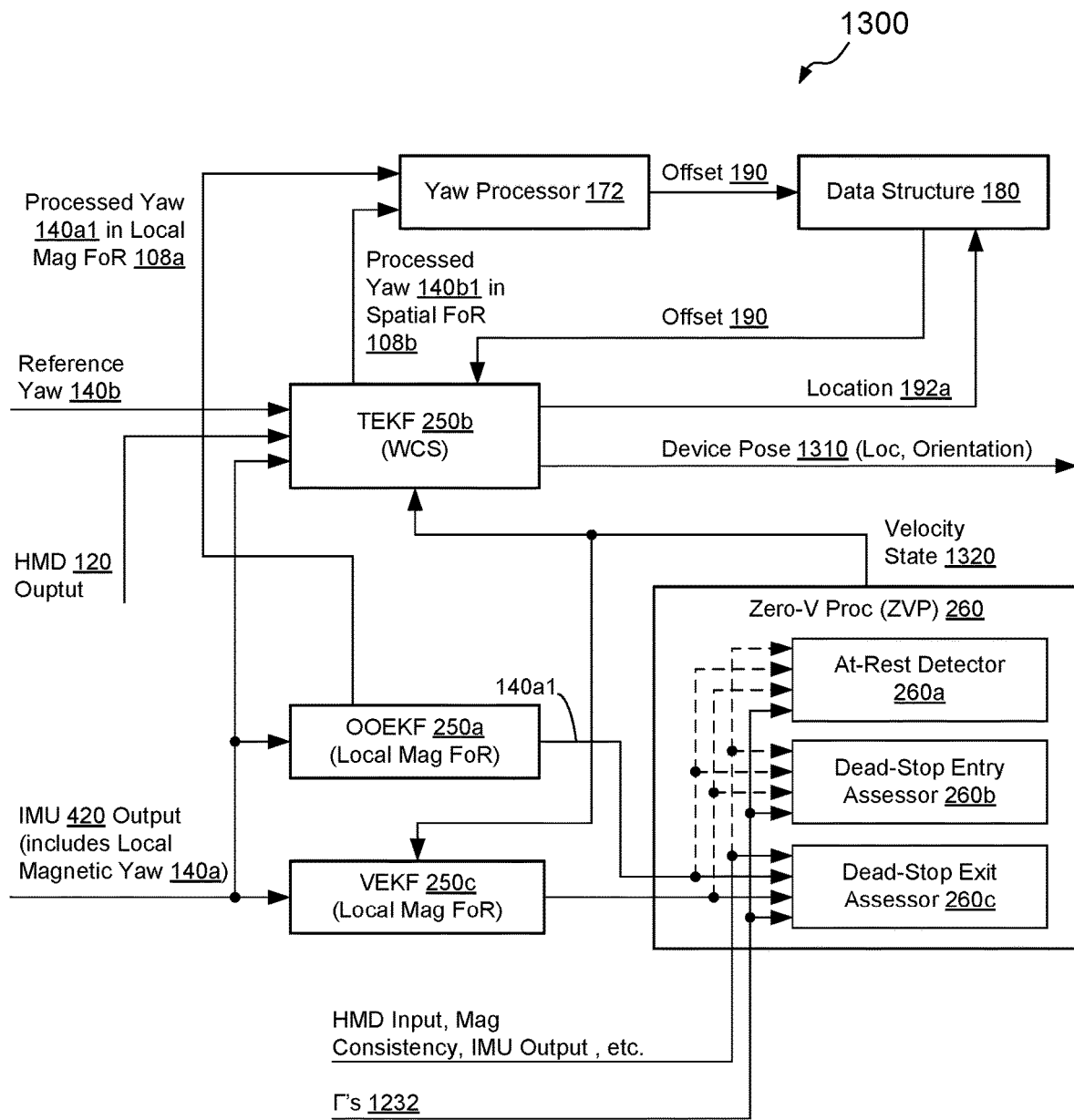
FIG. 13 is a block diagram of an example arrangement for determining when a dead-stop state is both entered and exited.

FIG. 13 shows in greater detail certain components of the server 170 that support both yaw measurement (Section I) and velocity-state detection (this Section II). Operative connections are shown among the EKFs 250, the ZVP 260, the yaw processor 172, and the data structure 180.

To support yaw measurements, the orientation-only EKF (OOEKF) 250*a* receives input from the IMU 420 in the device 130. The input includes measures of local magnetic yaw 140*a*, i.e., measurements of yaw in the device's local magnetic frame of reference (FoR) 108*a* (FIG. 1). OOEKF 250*a* processes the input 140*a* to generate output 140*a*1, which provides a processed version of the local magnetic yaw 140*a*. As OOEKF 250*a* tracks only orientation of the device 130, output 140*a*1 provides a very stable view of device orientation in the local magnetic FoR 108*a*.

At or about the same time that OOEKF 250*a* is processing a measurement of magnetic yaw 140*a*, the tracking EKF (TEKF) 250 receives and processes a measurement of reference yaw 140*b*, e.g., from the HMD 120 (FIG. 1). From this input, the TEKF 250*b* generates an output 140*b*1, which provides a processed version of the reference yaw 140*b*. In an example, the TEKF 250*b* uses an orientation measurement function into which the offset 190 from the data structure 180 is applied, enabling the TEKF 250*b* to track the device 130 in the spatial frame of reference 108*b*.

As shown, the TEKF 250*b* also receives input from IMU 420, offsets 190 from data structure 180, and velocity state 1320 from ZVP 260. It may further receive additional spatial inputs from the HMD 120. Based on the received information, TEKF 250*b* generates a location estimate 192*a* of the device 130, as well as an output for device pose 1310, which includes both device location and orientation. In some examples, the data structure 180 receives the location estimate 192*a* as the location 192 of the device 130 and uses that location estimate 192*a* for storing and/or retrieving offsets 190. The TEKF 250*b* is continually computing the next location estimate 192*a* based at least in part on the current location 192.

In some examples, the server 170 adjusts the variance of the TEKF 250*b* based on the nature of the offset 190 that is applied to the TEKF's orientation measurement function. For example, the server 170 sets a high variance (lower confidence) for an offset 190 that is based on a single image acquired from the HMD 120, whereas the server 170 sets a lower variance (higher confidence) for an offset based on an average of many samples. In some cases, the variance may scale with the count 190*a* (FIG. 2) of samples averaged together at the current location 192.

Continuing with reference to FIG. 13, the yaw processor 172 receives both the processed yaw 140*a*1 (from OOEKF 250*a*) and the processed yaw 140*b*1 (from TEKF 250*b*). From these inputs, the yaw processor 172 generates an offset 190, which may be stored in the data structure 180 in connection with a corresponding location estimate 192*a*.

As further shown, the velocity EKF (VEKF) 250*c* provides input to the ZVP 260 for assisting in the determination of velocity state 1320. In an example, the VEKF 250*c* tracks the full pose (location and orientation) of the device 130 in the local magnetic frame of reference 108*a*. Significantly, position and velocity as tracked by the VEKF 260*c* are both biased toward zero in all directions. For example, the VEKF 250*c* is tuned to detect changes in position and/or velocity from a quiescent state of all zeroes. The VEKF 260*c* then uses a zero-velocity measurement function to drive the velocity to zero. The variance used by this measurement function depends on the velocity state 1320. As with the TEKF 250*b*, variance is smaller in the dead-stop state and much larger in the at-rest state. In an example, the dead-stop exit assessor 260*c* monitors output from the VEKF 250*c*, e.g., in the form of position, velocity, and in some cases accelerometer bias of IMU 420. The dead-stop exit assessor 260*c* then exits the dead-stop state if the output changes by more than a threshold amount, as such changes indicate that the device 130 has started to move.

In the depiction of the ZVP 260, dashed lines indicate optional connections. Preferably, the dead-stop exit assessor 260*c* uses inputs from all sources: OOEKF 250*a*, VEKF 250*c*, and CSI (Gammas) 1232, as well as input from HMD 120, magnetic sensor 422, other IMU output, and the like. The at-rest detector 260*a* and the dead-stop entry assessor 260*b* both rely upon Gammas (Γ's) 1232, but may each receive additional input from the various sources to assist with their respective functions.

With the depicted arrangement, the server 170 may correct for drift in the IMU 420. For example, detection of an at-rest or dead-stop state can trigger a re-referencing of location as measured by the IMU 420 to the current estimate 192*a* of device location, e.g., as provided by the TEKF 250*b*. Such correction improves the trustworthiness of output from the IMU 420, at least in the short-term, as a determinant of location of the device 130. Detections of at-rest and/or dead-stop states are expected to occur frequently. Thus, consequent corrections of IMU drift can keep the IMU 420 generally accurate over time. Detections of both the at-rest and dead-stop states may trigger IMU correction, with dead-stop detections expected to produce more accurate corrections than at-rest detections on account of the generally more accurate location estimates 192*a* from the TEKF 250*b* during dead-stop than during at-rest. In addition to providing opportunities to correct for IMU drift, detections of at-rest and/or dead-stop states also allow the server 170 to average position estimates from multiple sources to build up highly accurate position values.

Given that the device 130 may be provided as a virtual pointer, such as the one described in incorporated U.S. patent application Ser. No. 15/655,489, it is essential for best user experience that orientation of the device 130 be measured accurately, as even small pointing errors can produce unsatisfactory results. It is also crucial to user experience that the velocity state 1320 of the device 130 be determined with as much certainty as possible.

To these ends, FIG. 14 shows a particular arrangement of components of device 130 that helps to promote accurate readings of both orientation and velocity. One should appreciate that the depiction of device 130 in FIG. 14 is merely illustrative of relevant features. No effort has been made to show the device 130 as it might eventually appear in a commercial product.

Here, the device 130 has a handle or hand grip 1420. A user (not shown) positioned to the left of the figure, might be expected to hold the device 130 with fingers wrapped around the grip 1420 and with the user's hand extending to the right. With this arrangement, the IMU 420 in the device 130 aligns approximately with the location of the user's wrist joint, such that the IMU 420 remains approximately stationary as the user pivots the wrist (assuming the user is otherwise stationary). In this manner, changes in orientation of the device 130 can be measured with a minimum velocity component.

The device 130 also includes an antenna 1410, which sends Wi-Fi packets from which the above-described CSI is generated. The antenna 1410, although functioning as a packet transmitter, may nevertheless be regarded as a velocity sensor, given that the server 170 determines the velocity state 1320 of the device 130 based on packets emitted by the antenna 1410.

As shown, the antenna (or velocity sensor) 1410 is located at the extreme end of the device 130, where it typically moves more than any other part of the device 130 in response to wrist rotation by the user. The antenna 1410 is thus optimally positioned for sensing velocity of the device 130, as any rotation of the user's wrist is amplified over the distance to the antenna 1410.

Although the depicted arrangement of components in FIG. 14 may be regarded as optimal, it is certainly not required. Other embodiments may use different arrangements.

FIG. 15 shows an example method 1500 that may be carried out in connection with the environment 100 and summarizes some of the features described in this section. The method 1500 is typically performed, for example, by the software constructs described in connection with FIGS. 2-4. The various acts of method 1500 may be ordered in any suitable way. Accordingly, embodiments may be constructed in which acts are performed in orders different from that illustrated, which may include performing some acts simultaneously.

At 1510, phase measurements are generated for each of a set of packets emitted by the device 130. In an example, such phase measurements are theta values (θ) based on CSI or other readings from the antenna arrays 160.

At 1520, differences are monitored between phase measurements made of different packets emitted at different times. For example, the at-rest detector 260*a* computes delta-theta (ΔΘ) values, which remove device-frequency offset, and computes delta-sigma (ΔΣ) values, which remove common-mode noise. Differences between ΔΣ values (ΔΓ's) are then determined between packets arriving at different times, such as 20 milliseconds apart.

At 1530, a particular velocity state 1320 of the device 130 is asserted based on a condition of the monitored differences. For example, the at-rest state 1280 may be asserted if any of the ΔΓ's falls below a threshold (FIG. 12*b*). Alternatively, the moving state 1290 may be asserted if all of the ΔΓ's exceed the same threshold. The dead-stop state may be asserted if the dead-stop entry assessor 260*b* detects stability in ΔΣ's over multiple packets.

An improved technique has been described for detecting a velocity state 1320 of a device 130. The technique includes generating multiple phase measurements (e.g., Θ values) for each of multiple packets 912 emitted by the device 130 and monitoring differences (e.g., ΔΘ's and ΔΣ's) between phase measurements made for different packets. The technique further includes asserting a particular state 1320 of the device 130 based on a condition of the monitored differences.

Having described certain embodiments, numerous alternative embodiments or variations can be made. For example, although certain velocity states have been shown and described, embodiments hereof may include a greater or lesser number of velocity states, or other velocity states not specifically described, such as a high-velocity state, a spinning state, a medium-velocity state, and the like. Further, although a computational approach based on CSI has been described, embodiments hereof may work with phase measurements made using other approaches, such as time-of-arrival, time-of-flight, mixed time-of-flight, angle-of-arrival, and the like. Further, although the illustrated embodiments make no assumption about packet-detection delays in Wi-Fi devices, the approach as described herein may be used advantageously in the event that Wi-Fi manufacturers start providing devices with constant (or consistent) packet-detection delays. Indeed, embodiments under such circumstances may be simpler that those illustrated, as constant packet detection delays may obviate the need to correct for device-frequency offset. Also, although detecting velocity state of a device has been described in connection with correcting for IMU drift, this is merely an example. Other uses of velocity detection include improving yaw measurement and, more generally, improving user experience by enabling a game or other application to represent movement of a device or user more realistically.

Further, although features have been shown and described with reference to particular embodiments hereof, such features may be included and hereby are included in any of the disclosed embodiments and their variants. Thus, it is understood that features disclosed in connection with any embodiment are included in any other embodiment.

Further still, the improvement or portions thereof may be embodied as a computer program product including one or more non-transient, computer-readable storage media, such as a magnetic disk, magnetic tape, compact disk, DVD, optical disk, flash drive, solid state drive, SD (Secure Digital) chip or device, Application Specific Integrated Circuit (ASIC), Field Programmable Gate Array (FPGA), and/or the like (shown by way of example as media 850 and 1150 in FIGS. 8 and 15). Any number of computer-readable media may be used. The media may be encoded with instructions which, when executed on one or more computers or other processors, perform the process or processes described herein. Such media may be considered articles of manufacture or machines, and may be transportable from one machine to another.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Further, although ordinal expressions, such as "first," "second," "third," and so on, may be used as adjectives herein, such ordinal expressions are used for identification purposes and, unless specifically indicated, are not intended to imply any ordering or sequence. Thus, for example, a "second" event may take place before or after a "first event," or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Although certain embodiments are disclosed herein, it is understood that these are provided by way of example only and should not be construed as limiting.

Those skilled in the art will therefore understand that various changes in form and detail may be made to the embodiments disclosed herein without departing from the scope of the following claims.

What is claimed is:

1. A method of detecting a velocity state of a device, comprising:
generating phase measurements for each of a set of packets emitted by the device;
monitoring differences between phase measurements made of different packets emitted at different times; and
asserting a particular velocity state of the device based on a condition of the monitored differences.

2. The method of claim 1, further comprising, upon an assertion of the particular velocity state of the device, correcting for drift in an IMU (Inertial Measurement Unit) of the device.

3. The method of claim 1, wherein generating the phase measurements includes, for each of the set of packets:
receiving the packet by multiple antennas of an antenna array; and
generating, for each of the multiple antennas, a respective phase measurement, theta, of the packet as received by the respective antenna.

4. The method of claim 3, wherein the antennas in the antenna array include an apex antenna and multiple base antennas, and wherein the method further comprises computing a respective difference, delta-theta, between the phase measurement of the apex antenna and the phase measurement of each of the base antennas, thereby producing a respective delta-theta for each of the base antennas.

5. The method of claim 4, further comprising:
representing each delta-theta as a respective sigma;
identifying multiple unique pairs of sigmas; and
for each of the unique pairs of sigmas, computing a respective difference, delta-sigma, between the sigmas of the respective pair, thereby producing multiple delta-sigmas.

6. The method of claim 5, wherein monitoring the differences between phase measurements made of different packets emitted at different times includes monitoring changes between delta-sigmas generated for a first packet and delta-sigmas generated for a second packet.

7. The method of claim 6, wherein the condition of the monitored differences is satisfied based at least in part on the changes between the delta-sigmas for the first and second packets being below a predetermined threshold.

8. The method of claim 6, further comprising:
computing a magnitude of changes between delta-sigmas generated for the first packet and delta-sigmas generated for the second packet; and
distinguishing, based on the computed magnitude of changes, movement of the device from changes in an environment around the device.

9. The method of claim 3, wherein generating the respective phase measurement for each of the multiple antennas includes, for each of the set of packets:
generating a CSI (Channel State Information) phase relationship for the respective packet as received by the respective antenna;
identifying a zero-tone phase value of the CSI phase relationship; and
deriving the respective phase measurement from the identified zero-tone phase value.

10. The method of claim 3, wherein the antenna array is a first antenna array, wherein generating the phase measurements further includes, for each of the set of packets, receiving the packet by multiple antennas of a second antenna array, and wherein the condition upon which the particular velocity state of the device is asserted is based on both a condition of monitored differences derived from the first antenna array and a condition of monitored differences derived from the second antenna array.

11. The method of claim 10, wherein generating the phase measurements further includes, for each of the set of packets, receiving the packet by multiple antennas of a third antenna array, and wherein the condition upon which the particular velocity state of the device is asserted is based on (i) a condition of monitored differences derived from the first antenna array, (ii) a condition of monitored differences derived from the second antenna array, and (iii) a condition of monitored differences derived from the third antenna array.

12. The method of claim 3, wherein the particular velocity state is an at-rest state, and wherein the method further comprises, in response to asserting the at-rest state of the device, checking whether the device is also at a dead stop.

13. The method of claim 3, further comprising:
analyzing phase differences derived from multiple packets received from the device during a sampling interval; and
based at least in part on deviations in the phase differences remaining below a predetermined limit during the sampling interval, entering a dead-stop state in which the device is asserted to be at a complete stop.

14. The method of claim 13, further comprising exiting the dead-stop state in response to changes in any of the following:
orientation of the device in the local magnetic field of reference (FoR);
output from an IMU (Inertial Measurement Unit) in the device;
location of the device as measured by an instrument separate from the device; and
phase differences between packets received from the device.

15. The method of claim 3, wherein the device has a Wi-Fi setting configured to disable packet aggregation, and wherein the method further comprises:
receiving a set of packets from the device in bursts, each burst including multiple packets; and
in response to current CSI (channel State Information) of a packet received in a current burst differing from previous CSI of a packet received in a previous burst by greater than a threshold amount, avoiding use of the current CSI in determining whether to assert the particular velocity state.

16. A computerized system, comprising a device that emits packets, a server, and a set of antenna arrays, the server constructed and arranged to:
generate phase measurements for each of a set of packets emitted by the device and received by the set of antenna arrays;
monitor differences between phase measurements made of different packets emitted at different times; and
assert a particular velocity state of the device based on a condition of the monitored differences.

17. A computer program product including a set of non-transitory, computer-readable media having instructions which, when executed by control circuitry of a computerized apparatus, cause the computerized apparatus to perform a method of detecting a velocity state of a device, the method comprising:
generating phase measurements for each of a set of packets emitted by the device;
monitoring differences between phase measurements made of different packets emitted at different times; and
asserting a particular velocity state of the device based on a condition of the monitored differences.

18. The computer program product of claim 17, wherein generating the phase measurements includes, for each of the set of packets:
receiving the packet by multiple antennas of an antenna array; and
generating, for each of the multiple antennas, a respective phase measurement, theta, of the packet as received by the respective antenna.

19. The computer program product of claim 18, wherein generating the respective phase measurement for each of the multiple antennas includes, for each of the set of packets:
generating a CSI (Channel State Information) phase relationship for the respective packet as received by the respective antenna;
identifying a zero-tone phase value of the CSI phase relationship; and
deriving the respective phase measurement from the identified zero-tone phase value.

20. The computer program product of claim 18, wherein the method further comprises:
analyzing phase differences derived from multiple packets received from the device during a sampling interval; and
based at least in part on deviations in the phase differences remaining below a predetermined limit during the sampling interval, entering a dead-stop state in which the device is asserted to be at a complete stop.

* * * * *